United States Patent
Wang et al.

(10) Patent No.: US 12,362,183 B2
(45) Date of Patent: Jul. 15, 2025

(54) SEMICONDUCTOR DEVICE AND METHOD FOR FABRICATING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chun-Yuan Wang, Hsinchu (TW); Miin-Jang Chen, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 513 days.

(21) Appl. No.: 17/736,819

(22) Filed: May 4, 2022

(65) Prior Publication Data
US 2023/0238240 A1 Jul. 27, 2023

Related U.S. Application Data

(60) Provisional application No. 63/303,775, filed on Jan. 27, 2022.

(51) Int. Cl.
*H01L 21/28* (2025.01)
*H10D 64/66* (2025.01)

(52) U.S. Cl.
CPC ..... *H01L 21/28088* (2013.01); *H10D 64/667* (2025.01)

(58) Field of Classification Search
CPC ................ H01L 21/28088; H10D 64/667
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 201403718 A 1/2014

OTHER PUBLICATIONS

Nerissa Draeger, "FinFETs Give Way to Gate-All-Around", retrieved from https://blog.lamresearch.com/finfets-give-way-to-gate-all-around/, Sep. 2020.

*Primary Examiner* — Igwe U Anya
(74) *Attorney, Agent, or Firm* — Maschoff Brennan

(57) ABSTRACT

A method for fabricating a semiconductor device is provided. The method includes depositing a gate dielectric layer over a semiconductor substrate; depositing a work function layer over the gate dielectric layer by an atomic layer deposition (ALD) process, wherein the work function layer comprises a metal element and a nonmetal element, and the ALD process comprises a plurality of cycles. Each of the cycles comprises: introducing a precursor gas comprising the metal element to a chamber to form a precursor surface layer on the semiconductor substrate in the chamber; purging a remaining portion of the precursor gas away from the chamber; performing a reactive-gas plasma treatment using a reactive-gas plasma comprising the nonmetal element to convert the precursor surface layer into a monolayer of the work function layer; purging a remaining portion of the reactive-gas plasma away from the chamber, and performing an inert-gas plasma treatment in the chamber.

20 Claims, 30 Drawing Sheets

(58) Field of Classification Search
USPC .......................................................... 257/407
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,626,281 | B2 * | 4/2023 | Chen ................. H01L 21/02274 438/785 |
| 2004/0106261 | A1 * | 6/2004 | Huotari ............ H01L 21/28088 438/785 |
| 2008/0102613 | A1 | 5/2008 | Elers |
| 2013/0105906 | A1 * | 5/2013 | Yin ................. H01L 21/823842 438/585 |
| 2014/0120700 | A1 * | 5/2014 | Wang ............... H01L 21/28556 438/477 |
| 2014/0187030 | A1 * | 7/2014 | Ji ......................... H01L 29/517 438/587 |
| 2015/0187653 | A1 * | 7/2015 | Niimi ............... H01L 21/82385 438/592 |
| 2018/0294342 | A1 | 10/2018 | Xiang et al. |
| 2021/0249331 | A1 | 8/2021 | Ueda et al. |

* cited by examiner

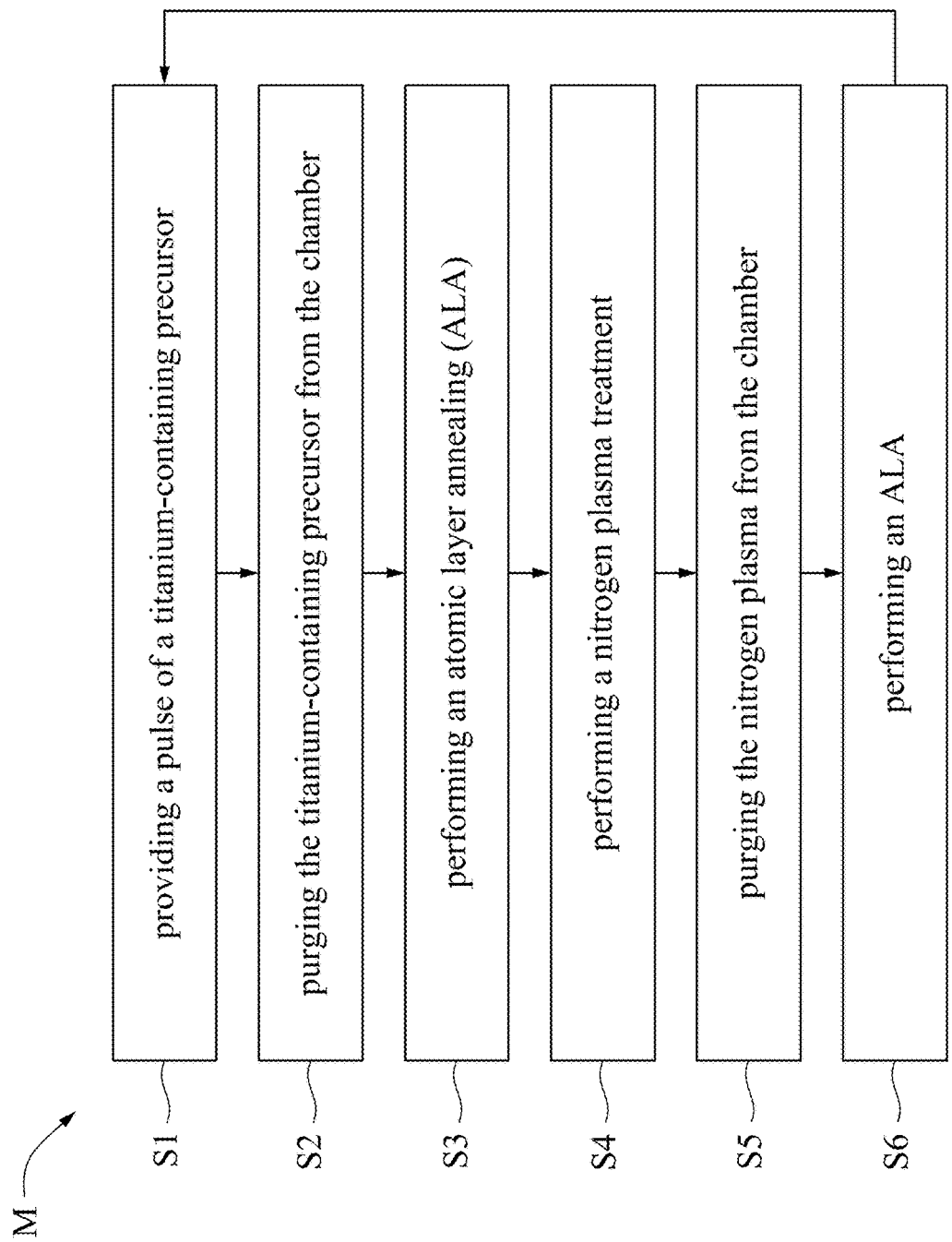

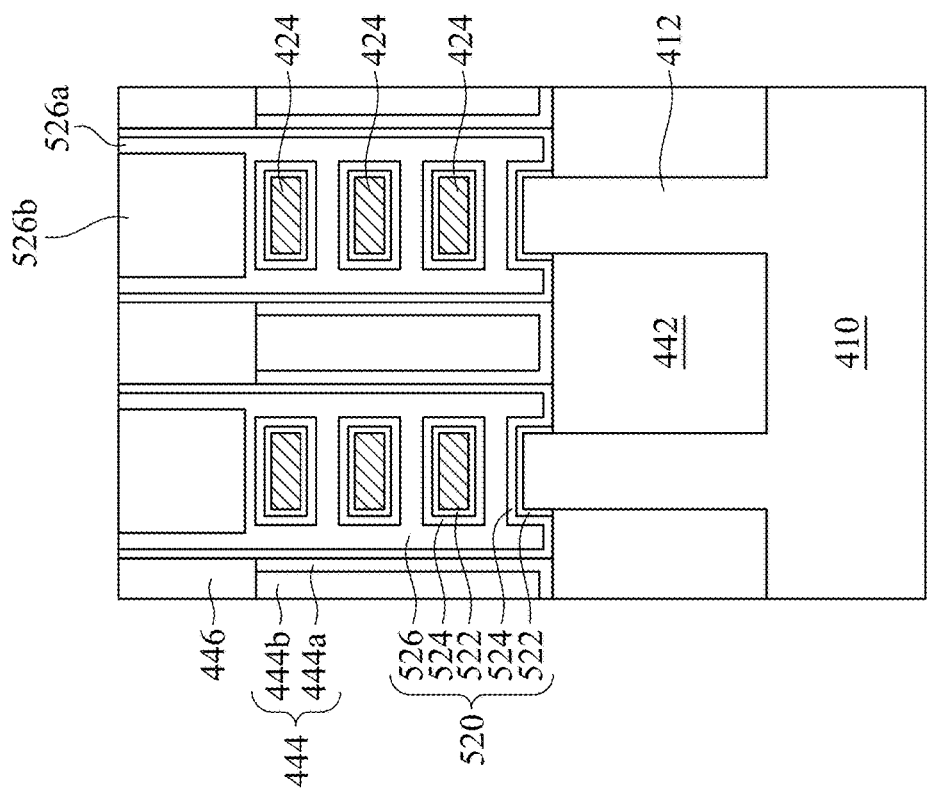
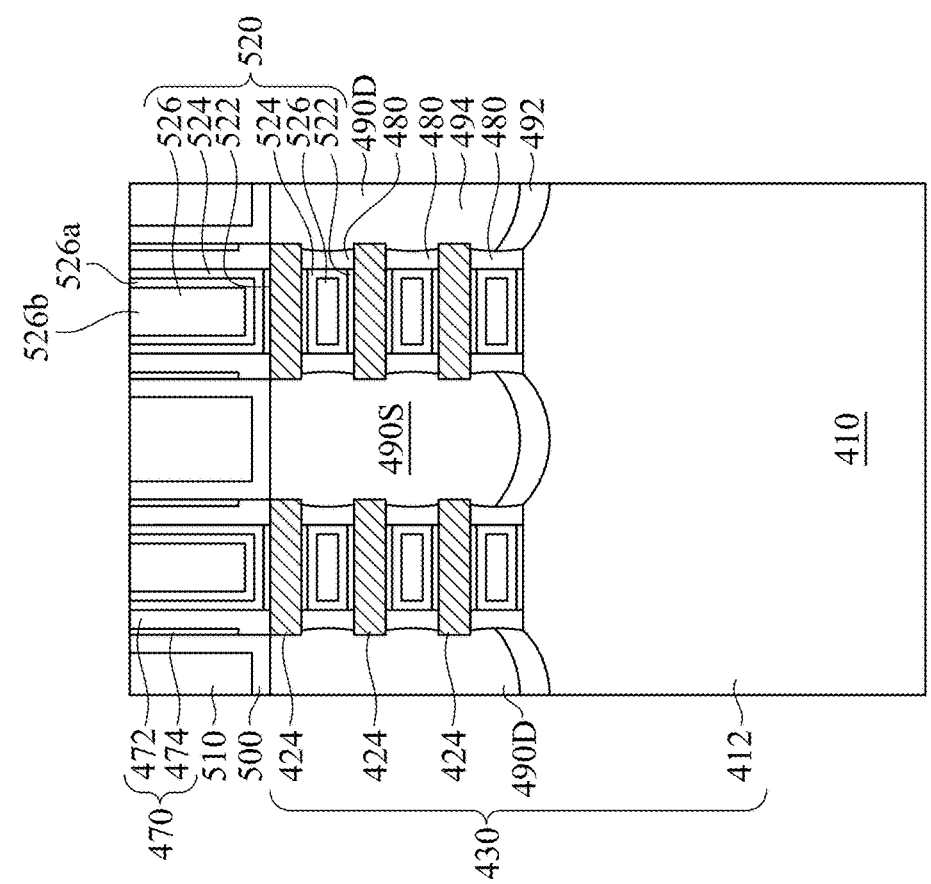
Fig. 20B
Fig. 20A

SEMICONDUCTOR DEVICE AND METHOD FOR FABRICATING THE SAME

PRIORITY CLAIM AND CROSS-REFERENCE

This application claims the benefit of U.S. Provisional Application No. 63/303,775, filed on Jan. 27, 2022, which application is hereby incorporated herein by reference in its entirety.

BACKGROUND

In the course of IC evolution, functional density (i.e., the number of interconnected devices per chip area) has increased while geometry size (i.e., the smallest component (or line) that can be created using a fabrication process) has decreased. This scaling down process provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have been formed with a gate oxide and polysilicon gate electrode. There has been a desire to replace the gate oxide and polysilicon gate electrode with a high-k gate dielectric and metal gate electrode to improve device performance as feature sizes continue to decrease.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flow chart of a cycle of the ALD according to some embodiments of the present disclosure.

FIGS. 13-21B illustrate perspective views and cross-sectional views of intermediate stages in the formation of a multi-gate device in accordance with some embodiments of the present disclosure.

DETAILED DESCRIPTION

Figure 1:
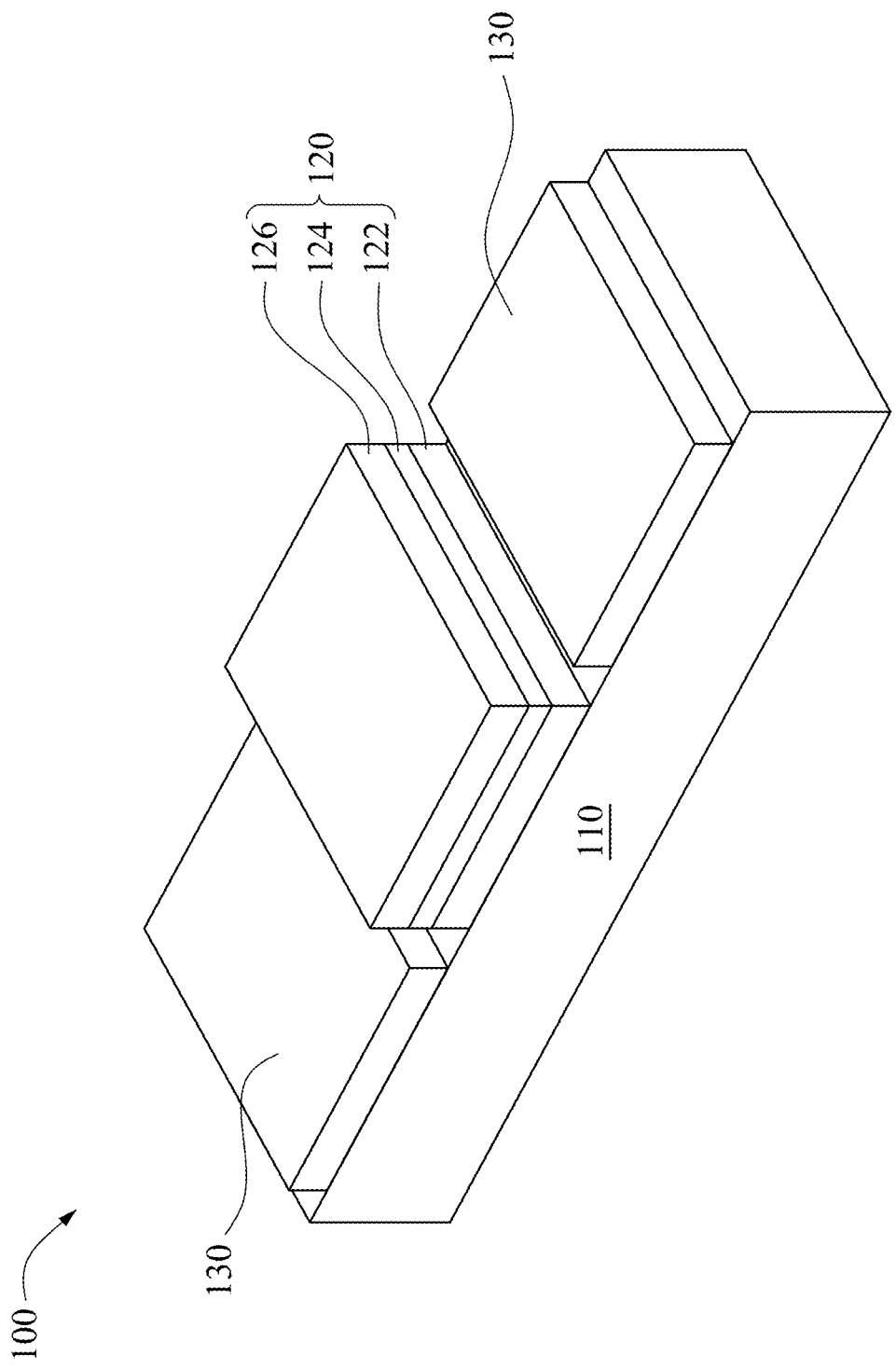
FIG. 1 is a schematic view of a complementary metal-oxide-semiconductor (CMOS) device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As the polysilicon gate electrode is replaced with a metal gate to improve device performance as feature sizes continue to decrease, tailoring the work function of the metal gate is critical to the electronic performance of the MOSFET devices. Embodiments of the present disclosure relate to a method for adjusting the work function of the metal gate at a low temperature (e.g., below about 400° C., such as about 300° C.), in which an atomic layer annealing (ALA) technique, i.e. the layer-by-layer, in-situ argon plasma treatment is incorporated into each atomic layer deposition cycle. This leads to a wide tunability of the work function of the metal gate. The sufficiently low work function is highly favorable to the low power consumption in n-type MOSFETs. The result indicates that the ALA technique is an advantageous approach to modulating the physical and material properties of metal gates in nanoscale MOS devices by precise energy transfer with atomic-scale accuracy. In the context, gases used in the ALA technique can be Ar, He, a mixture of Ar and He, the like, or the combination thereof.

FIG. 1 is a schematic view of a complementary metal-oxide-semiconductor (CMOS) device 100 according to some embodiments of the present disclosure. The device 100 includes a semiconductor substrate 110, a metal gate structure 120, and source/drain features 130. The metal gate structure 120 is over a channel region of the semiconductor substrate 110. In some embodiments, the metal gate structure 120 includes a gate dielectric layer 122, a work function metal layer 124, and a conductive layer 126. The source/drain features 130 are on opposite sides of the metal gate structure 120.

The gate dielectric layer 122 may include an interfacial layer and a high-k dielectric layer over the interfacial layer. The interfacial layer may be a silicon oxide layer ($SiO_2$), a silicon oxynitride (SiON) layer, and the like. The high-k dielectric layer may include a high-k material, such as hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), combinations thereof, and/or other suitable materials. The gate dielectric layer 122 may include oxides (e.g., $SiO_2$, $ZrO_2$, $HfO_2$, $TiO_2$, $Al_2O_3$, $Y_2O_3$) and/or nitrides (e.g., AlN, SiN, SiCN, SiOCN).

The work function metal layer 124 is used to provide desired work function for transistors to enhance device performance including the improved threshold voltage. In the embodiments of forming an NMOS transistor, the work function metal layer 124 can be an n-type work function metal layer. The n-type work function metal layer is capable of providing a work function value suitable for the device, such as equal to or less than about 4.5 eV. In the embodiments of forming a PMOS transistor, the work function metal layer 124 can be a p-type work function metal layer. The p-type work function metal layer is capable of providing a work function value suitable for the device, such as equal to or greater than about 4.8 eV. The work function metal layer may include metal, metal carbide, metal nitride, metal carbides, conductive metal oxides, or the combination thereof. The thickness and/or the compositions (e.g., doping) of the work function layer may be fine-tuned to adjust the work function level.

In present embodiments, the work function metal layer 124 may be deposited by cyclic deposition, such as by atomic layer deposition (ALD). In the cyclic deposition, multiple cycles of precursors are flowed to a surface of a substrate to deposit a layer thereover. For example, for TiN work function metal layer 124, each cycle includes providing a pulse of a titanium precursor (e.g., titanium chloride ($TiCl_4$)) and a pulse of a nitrogen plasma (e.g., an ammonia gas ($NH_3$)), to form TiN.

The conductive layer 126 may include polysilicon, tungsten (W), aluminum (Al), titanium (Ti), titanium nitride (TiN), tantalum (Ta), tantalum nitride (TaN), cobalt (Co), copper (Cu), nickel (Ni), ruthenium (Ru), Chromium (Cr), combinations thereof, and/or other suitable materials. The conductive layer 126 may include a higher electrical conductance than that of the work function metal layer 124. The conductive layer 126 may be deposited using CVD, PVD, plating, and/or other suitable processes.

In some embodiments, the source/drain features 130 may be formed by one or more epitaxy or epitaxial (epi) processes, and the source/drain features 130 may be referred to as epitaxy structures. For example, the source/drain features 130 may be Si features, SiGe features, and/or other suitable features formed in a crystalline state on the semiconductor substrate 110. In the embodiments of forming an NMOS transistor, the source/drain features 130 include an n-type semiconductor material, such as silicon, silicon carbide (SiC), silicon phosphide (SiP). In the embodiments of forming a PMOS transistor, the source/drain features 130 include a p-type semiconductor material, such as SiGe. In some other embodiments, the source/drain features 130 may be formed by doping regions of the semiconductor substrate 110. In the embodiments of forming an NMOS transistor, the source/drain features 130 may be formed by doping regions of the semiconductor substrate 110 with n-type dopants, such as arsenic or phosphorus. In the embodiments of forming a PMOS transistor, the source/drain features 130 may be formed by doping regions of the semiconductor substrate 110 with p-type dopants, such as boron.

Figure 2:
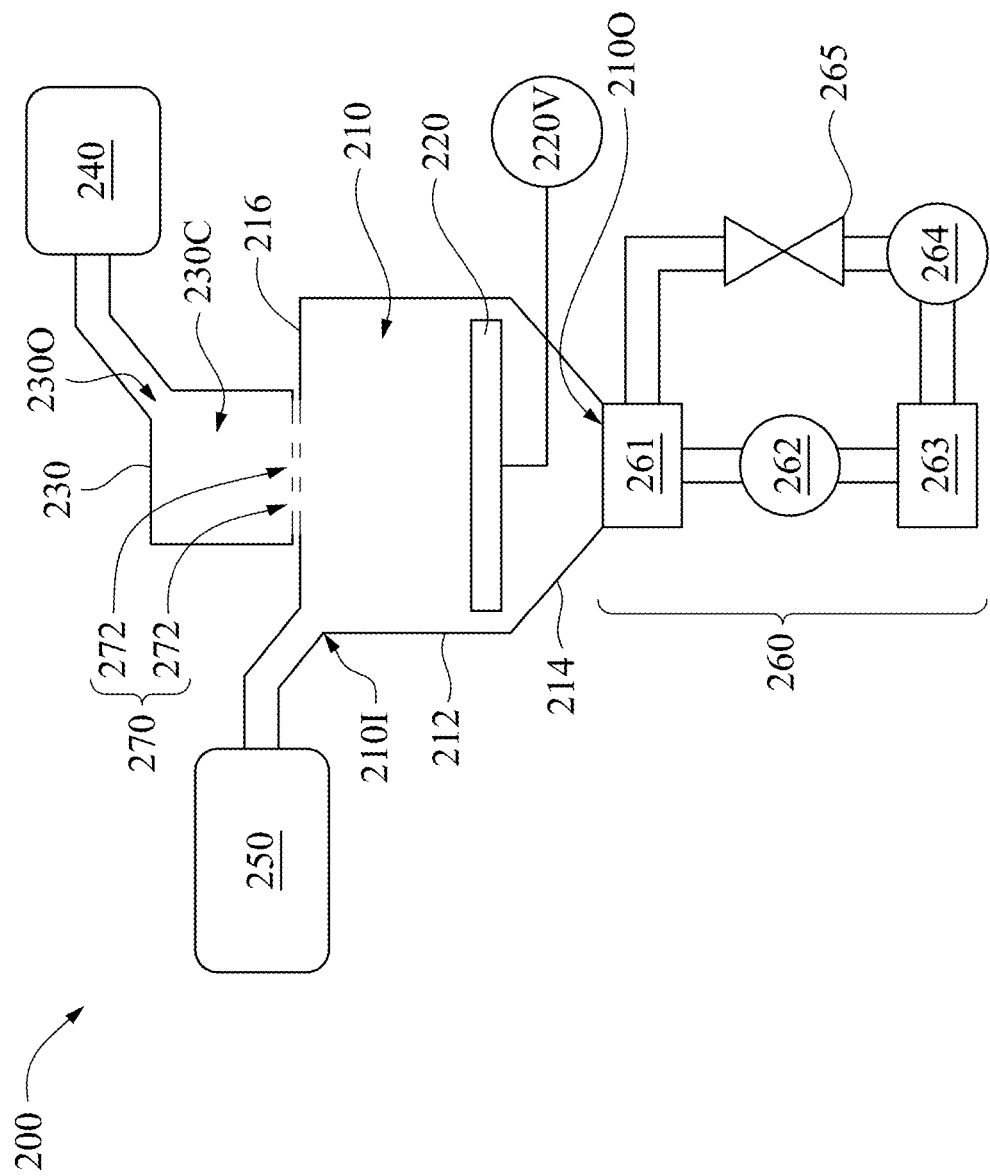
FIG. 2 is an apparatus for an atomic layer deposition (ALD) according to some embodiments of the present disclosure.

FIG. 2 is an apparatus 200 for ALD according to some embodiments of the present disclosure. The apparatus 200 may include a processing chamber 210, a substrate support 220, a plasma source 230, a plasma gas supplier 240, a gas delivery system 250, and a gas evacuation system 260. In some embodiments, the substrate (e.g., the substrate 110 in FIG. 1) may be loaded into the chamber 210 for performing ALD, for depositing the work function metal layer 124 over the substrate 110.

In some embodiments, the processing chamber 210 includes chamber walls 212, chamber floor 214, and chamber ceiling 216. Inside the processing chamber 210 is a substrate support 220, on which substrate (e.g., the substrate 110 in FIG. 1) sits. The substrate support 220 may be a chunk. The substrate support 220 may be connected to a substrate voltage source 220V for substrate biasing. For example, the substrate support 220 provides an AC bias, a DC bias, or an AC bias superposed with a DC bias, to a substrate disposed thereon.

The plasma source 230 is near the processing chamber 210. The plasma source 230 may include a plasma generator (not shown) for generating a plasma. The plasma generator includes hardware (e.g., coils, electrodes, etc.) for producing a plasma, which may be an inductively coupled plasma, a capacitively coupled plasma, a microwave coupled plasma, etc. In some embodiments, the plasma source 230 is a remote/upper chamber plasma source that has an upper chamber 230C above and separated from the processing chamber 210. The remote/upper chamber plasma source can be a radiofrequency (rf) plasma source operated in the frequency of from 3 kHz to 300 GHz. For example, a showerhead 270, having a plurality of showerhead holes 272, may be located between the upper chamber 230C and the processing chamber 210. The remote chamber plasma source 230 may generate a plasma within the upper chamber 230C, thereby reducing plasma-induced damage on the substrate surface. The remote chamber plasma source 230 has an inlet 2300 fluidly connected with the plasma gas supplier 240 for providing gas to generate the remote plasma. The plasma gas supplier 240 may provide desired gases, such as $N_2$, $H_2$, inner gas (e.g., Ar, He/Ar, Ne, a mixture thereof), the like, or the combination thereof. In some other embodiments, other suitable plasma sources (e.g., inductively coupled plasma (ICP) source, transformer coupled plasma (TCP), hollow cathode plasma (HCP), and/or the substrate voltage source 220V) may be used to directly generate plasma within the processing chamber 210. In some embodiments, the substrate voltage source 220V may be used for generating and/or affecting the plasma in the processing chamber 210. The substrate bias and the upper chamber plasma can be controlled at voltage mode or power mode, together with an auto pressure control (APC) system, such that the precise control of the energy of incident electrons/ions on the substrate can be achieved.

The processing chamber 210 also includes an inlet 2101 and an exhaust outlet 2100. The precursor delivery system 250 and the gas evacuation system 260 are respectively fluidly connected to the inlet 2101 and the exhaust outlet 2100. The precursor delivery system 250 may provide desired precursors, such as titanium precursor, such as titanium chloride ($TiCl_4$). The gas evacuation system 260 may include various components, such as a trap 261, automatic pressure controller (APC) 262, turbomolecular pump (TMP) 263, a rotary pump (RP) 264, and a valve 265. These components are used to control the gas exhaustion.

In some embodiments, the apparatus 200 may further include a controller coupled to the plasma source 230, the substrate voltage source 220V, the plasma gas supplier 240, the gas delivery system 250, and the gas evacuation system 260. In some implementations, fewer or more components can be coupled to the controller. The controller may include a processor, a computer-readable medium, and an input/output (I/O) interface. The processor is used to perform calculations related to controlling at least some of the pressure, gas flow rates, plasma generation, substrate biasing, and other system parameters. A computer-readable medium (also referred to as a database or a memory) is coupled to the processor in order to store data used by the processor and other system elements. Using the processor, the memory, and the I/O interface, a user is able to operate the system to deposit material as described herein. The processor may include dedicated circuitry, ASICs, combinatorial logic, other programmable processors, combinations thereof, and the like. The processor can execute instructions and data. For example, the processor embodies at least part of the instructions for performing the method in accordance with the present disclosure in software, firmware and/or hardware. The memory may include a hard disk drive, flash memory, a floppy disk drive along with associated removable media, an optical drive, removable media cartridges, and other storage media. The memory can store instructions and data executed by the processor.

Figure 3:
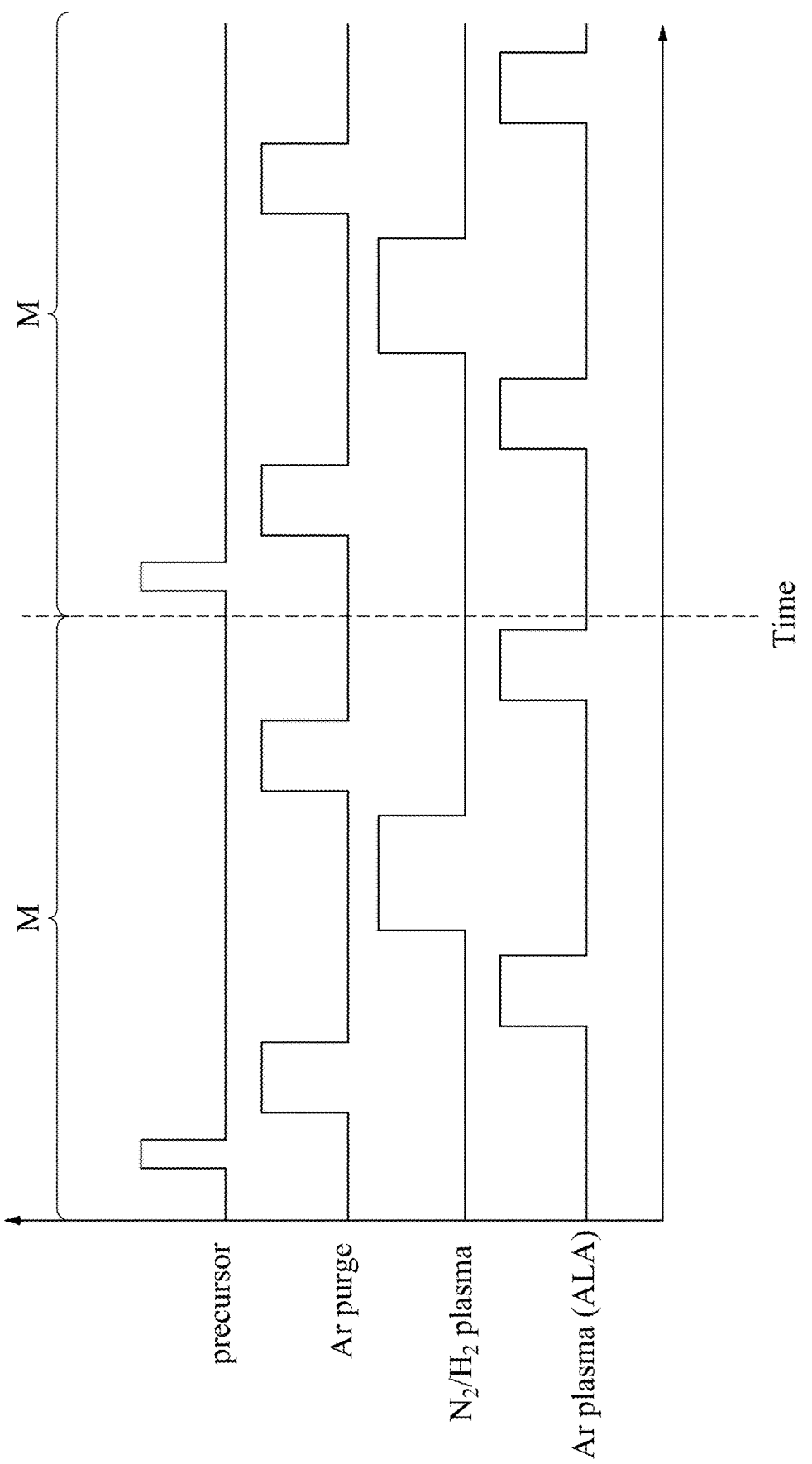
FIG. 3 shows pulses versus time in the cycles of the ALD according to some embodiments of the present disclosure.

FIG. 3 shows pulses versus time in the cycles M of the ALD according to some embodiments of the present disclosure. In some embodiments of the present disclosure, as ALD is a layer-by-layer process, at least one in-situ plasma treatment using inner gas (e.g., Ar plasma treatment) is applied in each ALD cycle M. For example, each cycle M may include the pulse of the titanium precursor (e.g., tetrakis (dimethylamino)titanium (TDMATi)), the pulse of a nitrogen plasma (e.g., $N_2/H_2$ plasma), purging pulses (e.g., Ar purge), and one or more pulses of inert-gas plasma (e.g., Ar plasma). The inert-gas plasma treatment can increase the surface temperature of the sample, leading to an annealing effect during the layer-by-layer ALD growth. In this context, the in-situ layer-by-layer plasma treatment using inner gas in each ALD cycle M can be denoted as atomic-layer annealing (ALA). The ALA may enhance the adatom movement and migration at the surface, thereby improving the crystallization of the deposited film. The ALA may also remove ligands of the chemisorbed precursors. The physical and chemical properties of deposited film can be tailored by the ALA.

FIG. 4 is a flow chart of a cycle M of an ALD according to some embodiments of the present disclosure. FIGS. 5A-5F illustrate various stages in a cycle M of a PEALD according to some embodiments of the present disclosure. Each cycle M may include steps S1-S6, as the pulses shown in FIG. 3. At step S1, where a pulse of a titanium-containing precursor is provided. At step S2, the titanium-containing precursor is purged away from the ALD chamber. At step S3, an ALA is performed. At step S4, a nitrogen-containing plasma is introduced. At step S5, the nitrogen-containing plasma is purged away from the ALD chamber. At step S6, an ALA is performed. It is understood that additional steps may be provided before, during, and after the steps S1-S6 shown in FIG. 4, and some of the steps described below can be replaced or eliminated for additional embodiments of the method. The order of the operations/processes may be interchangeable.

Figure 5A:
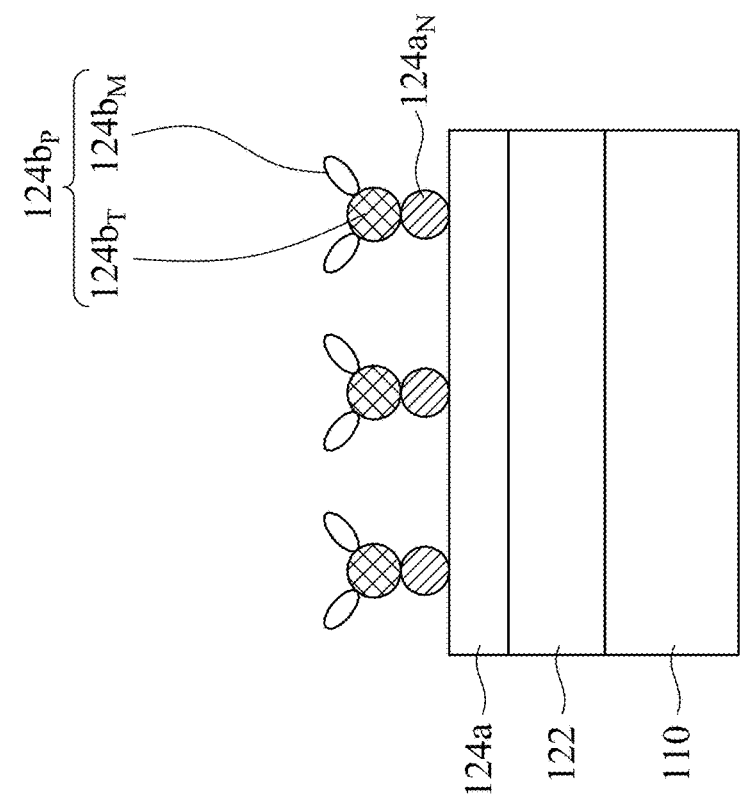
FIGS. 5A-5F illustrate various stages in a cycle of an ALD according to some embodiments of the present disclosure.

Reference is made to FIGS. 4 and 5A. At step S1, as the titanium-containing precursor pulse of FIG. 3, the substrate 110 is exposed to a titanium-containing precursor $124b_P$. In some embodiments, the titanium-containing precursor $124b_P$ may be illustrated as TDMATi, for example, including titanium atoms $124b_T$ and $Me_2N$ $124bm$. The titanium atoms $124b_T$ of titanium-containing precursor $124b_P$ may chemically adsorb/bond a surface of a former layer (e.g., a former titanium-and-nitrogen-containing monolayer 124a over a gate dielectric layer 122). For example, the former titanium-and-nitrogen-containing monolayer 124a may include $NH_2$ (including nitrogen atoms $124a_N$ and hydrogen atoms $124a_H$), and the titanium atoms $124b_T$ of the titanium-containing precursor $124b_P$ may replace the hydrogen atoms $124a_H$ and connect the nitrogen atoms $124a_N$. Stated differently, during the titanium-containing pulse, a titanium-containing precursor gas is introduced to the ALD chamber (e.g., by the gas delivery system 250 in FIG. 2), to form a precursor surface layer (i.e., a layer of the titanium-containing precursor $124b_P$) on the semiconductor substrate 110.

In some embodiments, the time of the titanium-containing pulse is in a range from about 0.01 to about 3 seconds, such as from about 0.1 to about 1 second. If the time of the titanium-containing pulse is greater than about 3 seconds, it causes the waste of the precursor. If the time of the titanium-containing pulse is less than about 0.01 second, the amount of precursor adsorbed on the surface is insufficient. In some embodiments, during the titanium-containing pulse, the gas delivery system 250 (referring to FIG. 2) may provide a mixture of the titanium-containing precursor and the Ar gas to the ALD chamber (e.g., the ALD chamber 210 in FIG. 2), in which the Ar gas is in a first flow rate range from about 10 sccm to about 50 sccm.

Figure 5B:
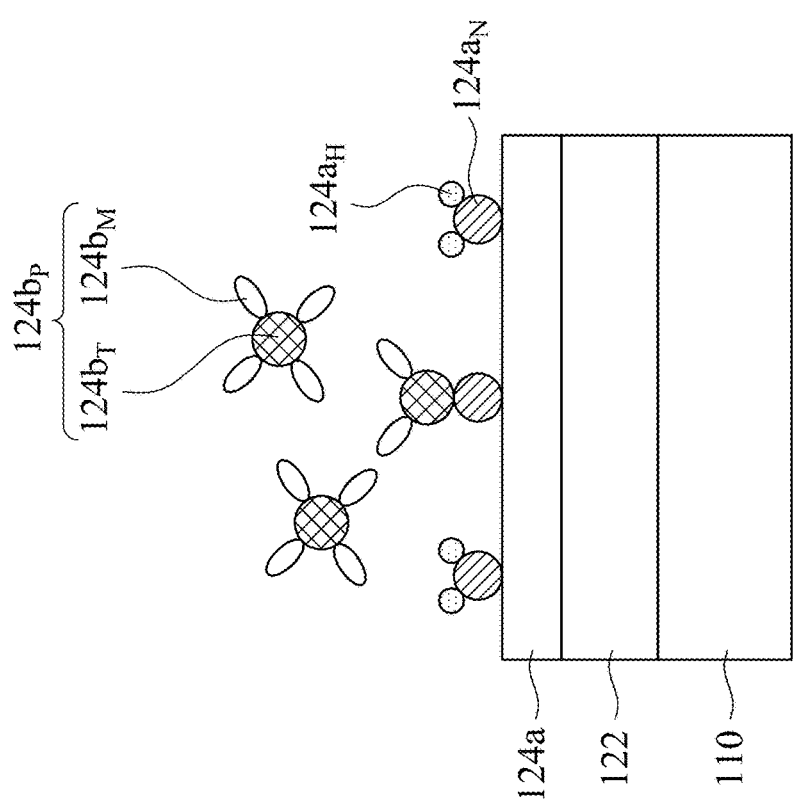

Reference is made to FIGS. 4 and 5B. At step S2, as the pulse of Ar purge in FIG. 3, a purge process is performed to remove any remaining titanium-containing precursor $124b_P$ and any byproducts from the ALD chamber (e.g., the ALD chamber 210 in FIG. 2). After the purge process, the layer of the titanium-containing precursor $124b_P$ (i.e., the precursor surface layer) is left on the surface. In some embodiments, the purging time is in a range from about 0.5 to about 150 seconds, such as from about 10 to about 20 seconds. If the purging time is greater than about 150 seconds, the processing time is unnecessarily increased. If the purging time is less than about 0.5 seconds, the titanium-containing precursor $124b_P$ may not be purged away from the chamber. In some embodiments, for purging, the gas delivery system 250 (referring to FIG. 2) provides the Ar gas to the chamber 210 (referring to FIG. 2) at a faster rate than the Ar flow rate at step S1. For example, the Ar gas is in a second flow rate range from about 60 sccm to about 140 sccm.

Figure 5D:
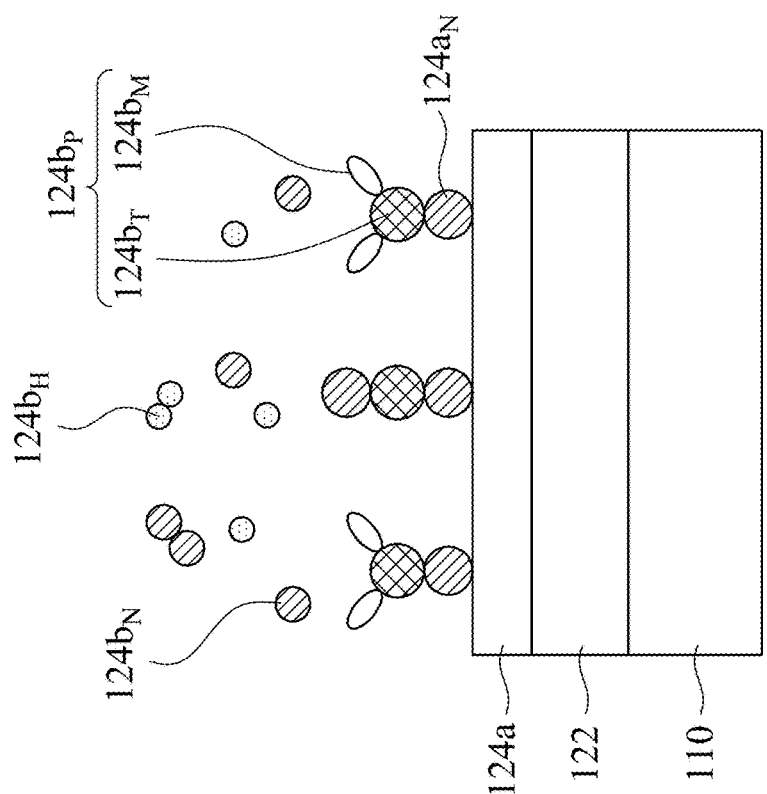
Figure 5C:
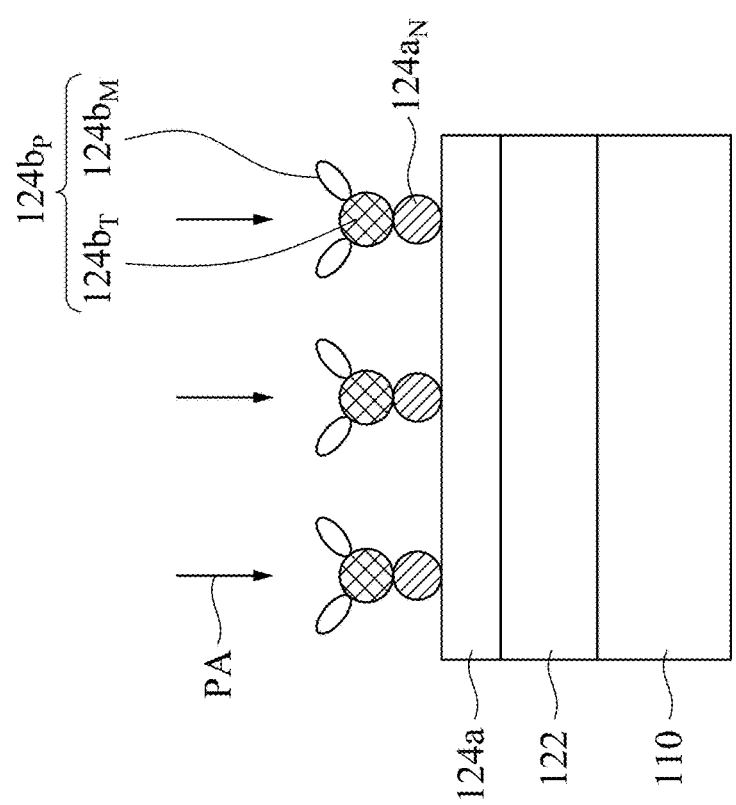

Reference is made to FIGS. 4 and 5C. At step S3, an ALA is performed by an in-situ inert-gas plasma treatment. For example, Ar plasma (also referred to as an Ar plasma pulse) PA1 may be provided, as the pulse of Ar plasma in FIG. 3. The ALA may be performed without nitrogen in an ALD chamber. During the Ar plasma pulse, the plasma power of the plasma source 230 may be in a range from about 1 W to about 1200 W, such as from about 10 W to about 600 W. If the plasma power is greater than about 1200 W, the precursor surface layer may be damaged/etched. If the plasma power is less than about 1 W, the material properties and the work function of the deposited layer may not be modulated. In some embodiments, the ALA treatment time (also can be referred to as the inner-gas plasma treatment time or a time of the Ar plasma pulse) is in a range from about 1 to about 300 seconds, such as from about 10 to about 100 seconds. The ALA treatment time may be greater than the time of the titanium-containing pulse. If the ALA treatment time is greater than about 300 seconds, the precursor surface layer may be damaged/etched. If the ALA treatment time is less than about 1 second, the material properties and the work function of the deposited layer may not be modulated. In some embodiments, during the Ar plasma treatment, the plasma gas supplier 240 (referring to FIG. 2) provides Ar gas to the upper chamber 230C (referring to FIG. 2) for generating Ar plasma. In some embodiments, the gas delivery system 250 may also provide Ar gas to the chamber 210 in a first flow rate range from about 10 sccm to about 50 sccm.

Reference is made to FIGS. 4 and 5D. At step S4, a nitrogen-containing plasma treatment is performed, which can be referred to as a nitrogen-containing plasma pulse, such as the pulse of $N_2/H_2$ plasma in FIG. 3. The nitrogen $124b_N$ may react with the titanium-containing precursor $124b_P$ left on the surface, thereby forming a titanium-and-nitrogen-containing monolayer $124b$ on the surface. In some embodiments, during the nitrogen-containing plasma pulse, the plasma gas supplier 240 (referring to FIG. 2) provides a mixture of $N_2$ and $H_2$ to the upper chamber 230C (referring to FIG. 2) for generating $N_2/H_2$ plasma. The $N_2$ gas may be provided at a flow rate in a range from about 1 sccm to about 300 sccm, such as from about 10 sccm to about 50 sccm. If the flow rate of the $N_2$ gas is greater than about 300 sccm, it causes the waste of the reactant. If the flow rate of $N_2$ gas is less than about 1 sccm, the amount of nitrogen $124b_N$ is inefficient to react with the titanium-containing precursor $124b_P$, and the titanium-and-nitrogen-containing monolayer $124b$ may not be well formed. In some embodiments, during the nitrogen-containing plasma pulse, the $H_2$ gas may be provided at a flow rate in a range from about 1 sccm to about 300 sccm, such as from about 10 sccm to about 50 sccm. If the flow rate of the $H_2$ gas is greater than about 300 sccm, it causes the waste of the reactant. If the flow rate of $H_2$ gas is less than about 1 sccm, the amount of nitrogen $124b_N$ is insufficient to react with the titanium-containing precursor $124b_P$, and the titanium-and-nitrogen-containing monolayer $124b$ may not be well formed. In the present embodiments, the nitrogen gas is used as a reactive gas for generating plasma, to react with and convert the precursor surface layer into a monolayer of the work function layer. In some other embodiments, other reactive gas (sun as $NH_3$ or $NH_3$ plasma) may be used for generating plasma to react with the precursor surface layer depending on the metal element of the precursor.

In some embodiments, during the nitrogen-containing plasma pulse, the gas delivery system 250 may provide the Ar gas, provided by the gas delivery system 250 in the first flow rate range from about 10 sccm to about 50 sccm. During the nitrogen-containing plasma pulse, the plasma power of the plasma source 230 may be in a range from about 1 W to about 1200 W, such as from about 10 W to about 600 W. If the plasma power is greater than about 1200 W, the titanium-and-nitrogen-containing monolayer $124b$ may be damaged/etched. If the plasma power is less than about 1 W, the amount of nitrogen $124b_N$ is insufficient to react with the titanium-containing precursor $124b_P$, and the titanium-and-nitrogen-containing monolayer $124b$ may not be well formed. In some embodiments, the plasma treatment time (also can be referred to as the time of the nitrogen-containing plasma pulse) is in a range from about 1 second to about 300 seconds, such as from about 10 seconds to about 100 seconds. If the plasma treatment time is greater than about 300 seconds, the titanium-and-nitrogen-containing monolayer $124b$ may be damaged/etched. If the time of the plasma treatment time is less than about 1 second, the amount of nitrogen $124b_N$ is insufficient to react with the titanium-containing precursor $124b_P$, and the titanium-and-nitrogen-containing monolayer $124b$ may not be well formed.

Figure 5F:
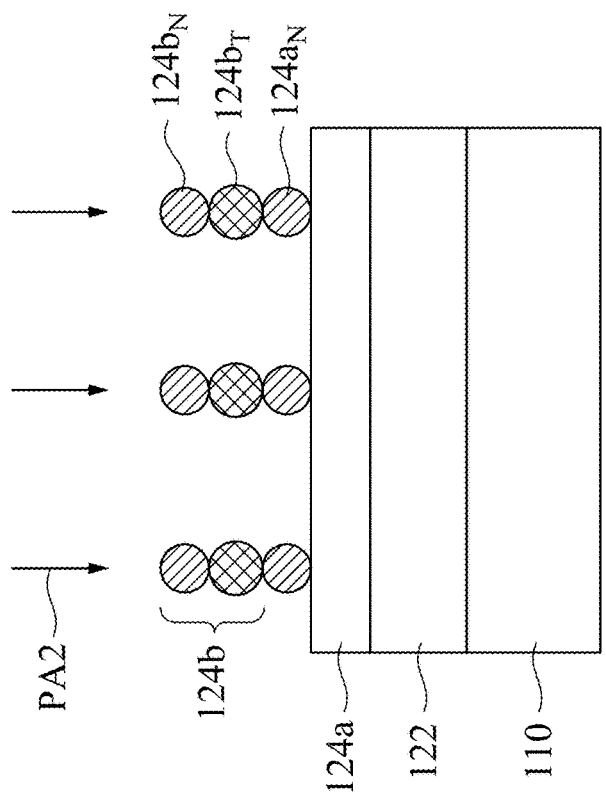
Figure 5E:
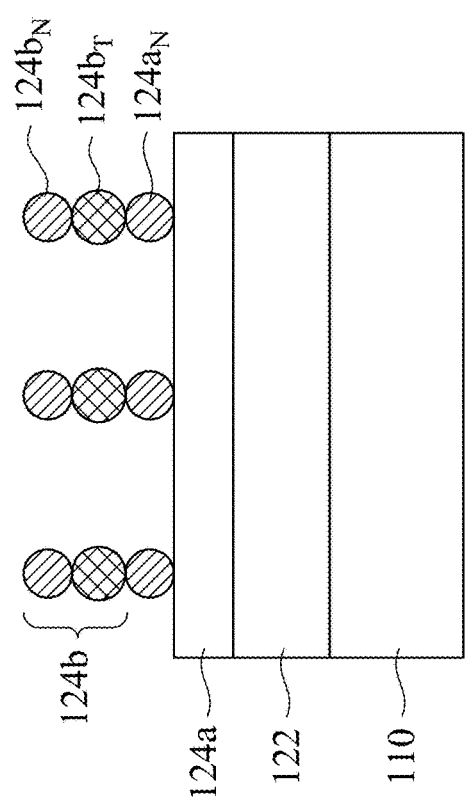

Reference is made to FIGS. 4 and 5E. At step S5, as the pulse of Ar purge in FIG. 3, a purge process is performed to remove any remaining $N_2/H_2$ gas (e.g., the unreacted nitrogen atoms $124a_N$ and hydrogen atoms $124a_H$) and any byproducts from the ALD chamber. After the purging process, the titanium-and-nitrogen-containing monolayer $124b$ is left on the surface. In some embodiments, the purging time is in a range from about 0.5 to about 150 seconds, such as from about 5 to about 15 seconds. If the purging time is greater than about 150 seconds, the processing time is unnecessarily increased. If the purging time is less than about 0.5 seconds, the $N_2/H_2$ gas may not be purged away from the chamber. In some embodiments, for purging, the gas delivery system 250 (referring to FIG. 2) provides the Ar gas to the chamber 210 (referring to FIG. 2) at a faster rate than the flow rate at step S3. For example, the Ar gas is in a second flow rate range from about 60 sccm to about 140 sccm.

Reference is made to FIGS. 4 and 5F. At step S6, an ALA is performed by in-situ inert-gas plasma treatment. For example, Ar plasma (also referred to as an Ar plasma pulse) PA2 may be provided. The ALA may be performed without nitrogen in an ALD chamber. During the Ar plasma pulse, the plasma power of the plasma source 230 may be in a range from about 1 W to about 1200 W, such as from about 10 W to about 600 W. If the plasma power is greater than about 1200 W, the precursor surface layer may be damaged/etched. If the plasma power is less than about 1 W, the material properties and the work function of the deposited layer may not be modulated. In some embodiments, the ALA treatment time is in a range from about 1 second to about 300 seconds, such as from about 10 seconds to about 100 seconds. The ALA treatment time may be greater than the time of the titanium-containing pulse. If the ALA treatment time is greater than about 300 seconds, the titanium-and-nitrogen-containing monolayer may be damaged. If the ALA treatment time is less than about 1 second, the material properties and the work function of the deposited layer may not be modulated.

In some embodiments, during the Ar plasma treatment, the plasma gas supplier 240 (referring to FIG. 2) provides Ar gas to the upper chamber 230C (referring to FIG. 2) for generating Ar plasma. In some embodiments, the gas delivery system 250 may also provide Ar gas to the chamber 210 in a first flow rate range from about 10 sccm to about 50 sccm.

Steps S1-S6 constitute one ALD cycle M, which includes two deposition phases (step S1 and step S4), two purge phases (step S2 and step S5), and two atomic layer annealing (ALA) phases (step S3 and step S6). In some embodiments, the one or more annealing phases (step S3 and/or step S6) may be omitted from the ALD cycle M.

In some embodiments, each ALD cycle M is a self-limiting process, where less than or equal to about one titanium-and-nitrogen-containing monolayer is deposited during each ALD cycle. The ALD cycle is repeated until a titanium nitride layer reaches a desired (target) thickness. For example, if the thickness of the titanium nitride layer equals a target thickness (or is within a given threshold of the target thickness), then the ALD process ends at the end of the ALD cycle M. If the thickness of the titanium nitride layer does not equal the target thickness (or is not within the given threshold of the target thickness), then ALD process returns to step S1 to begin another ALD cycle M. Additional steps can be provided before, during, and after ALD process, and some of the steps described can be moved, replaced, or eliminated for additional embodiments of the ALD process.

Figure 6B:
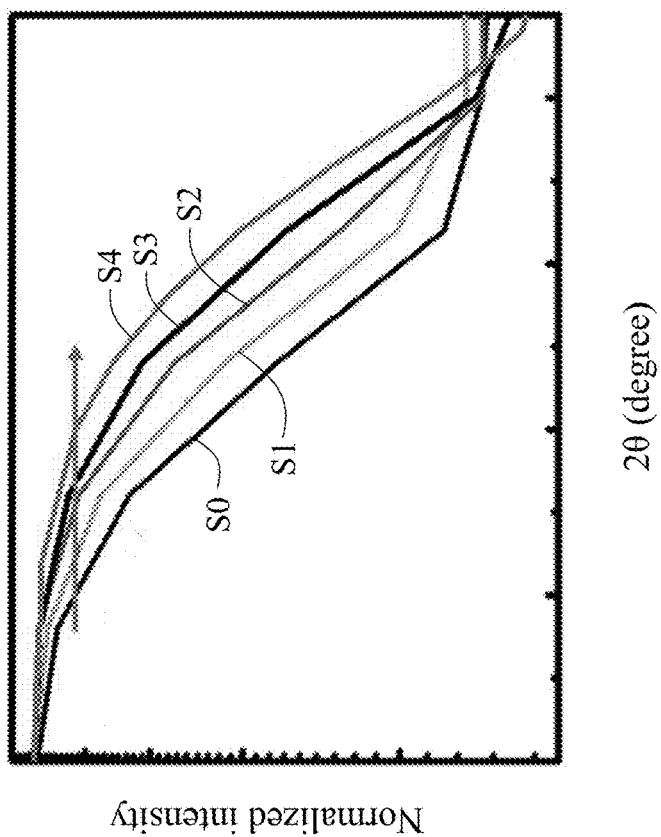
FIG. 6B is an enlarged view of a portion of FIG. 6A.
Figure 6A:
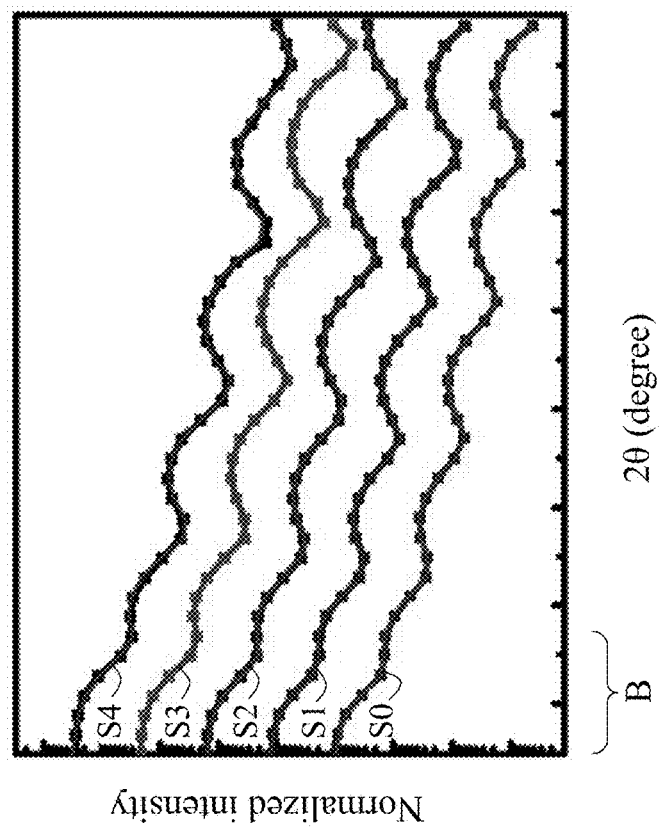
FIG. 6A shows the results of various deposited TiN films under X-ray reflectance (XRR) according to some embodiments of the present disclosure.

FIG. 6A shows the X-ray reflectance (XRR) results of various deposited TiN films according to some embodiments of the present disclosure. A beam of X-rays is directed toward a sample, and the scattered intensity is measured as a function of the outgoing direction. The angle between the incoming and outgoing beam directions is referred to as 2θ. In FIG. 6A, the 2θ is shown on the horizontal axis, and an XRR intensity is shown on the vertical axis. Samples S0-S4 are TiN/SiO$_2$/p-Si/Al metal-oxide-semiconductor (MOS) in structure. For sample S0, the TiN film is deposited without the ALA treatment. For sample S1, the TiN film is deposited with the ALA treatment for a first ALA treatment time (e.g., from about 5 seconds to about 15 seconds). For sample S2, the TiN film is deposited with the ALA treatment for a second ALA treatment time (e.g., from about 15 seconds to about 25 seconds). For sample S3, the TiN film is deposited with the ALA treatment for a third ALA treatment time (e.g., from about 35 seconds to about 45 seconds). For sample S4, the TiN film is deposited with the ALA treatment for a fourth ALA treatment time (e.g., from about 55 seconds to about 65 seconds). The first to fourth ALA treatment time increases in a sequence. The plasma power is kept the same in these ALA treatments. From the XRR pattern and the fitting curves, the density and thickness of the TiN layers can be extracted.

FIG. 6B is an enlarged view of the portion B of FIG. 6A. In FIG. 6B, the 2θ is shown on the horizontal axis, and a normalized intensity is shown on the vertical axis. The intensities of the samples S0-S4 in FIG. 6A are normalized to 1. In XRR, the film density is closely related to the critical angle of X-ray total reflection. From FIG. 6B, as the ALA treatment time increases from sample S1 to sample S4, it can be observed that the critical angle increases with the ALA treatment time, which indicates the film density increases with the increase of the ALA treatment time, as indicated by the arrow in the figure.

Figure 6C:
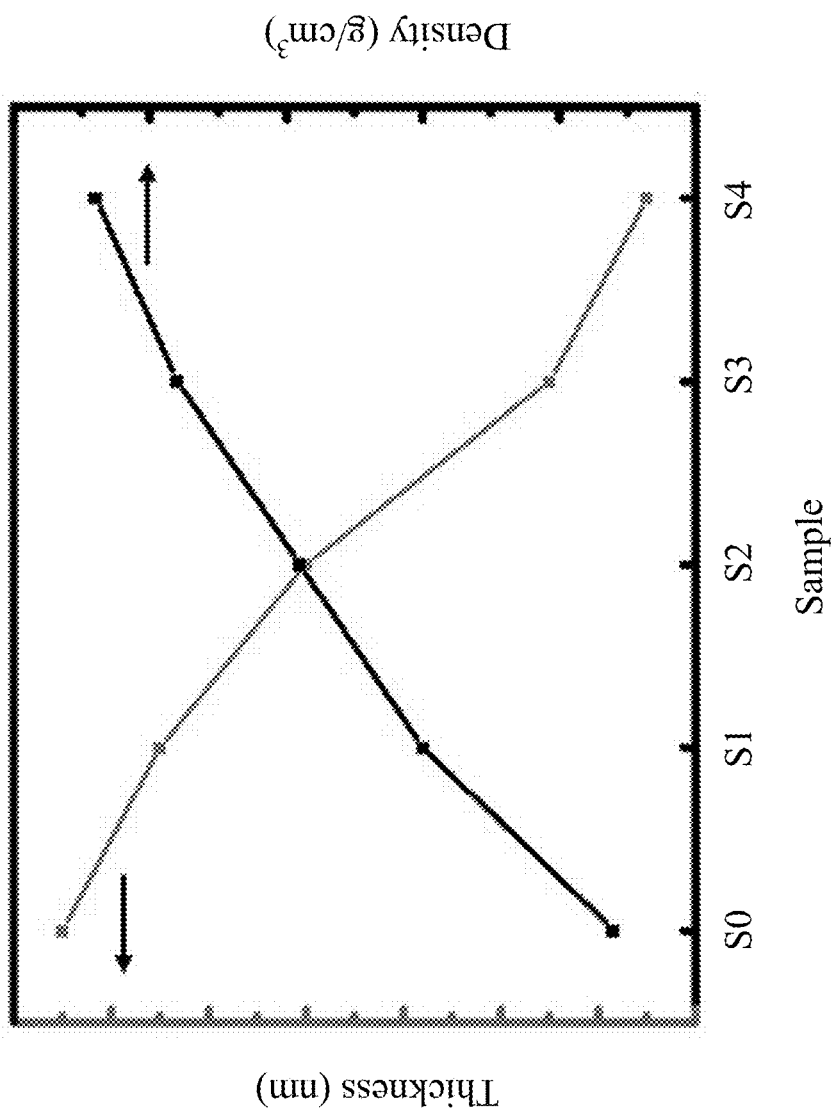
FIG. 6C shows the thickness and density of various deposited TiN films by fitting the results of FIG. 6A according to some embodiments of the present disclosure.

FIG. 6C shows the thickness and density of various deposited TiN films by fitting the results of FIG. 6A according to some embodiments of the present disclosure. In FIG. 6C, the thickness is shown on the left vertical axis, the density is shown on the right vertical axis. Comparing the samples S1-S4 with the sample S0, it can be observed that the samples S1-S4 have lower film thicknesses and higher film densities than that of the sample S0. This indicates that the ALA treatment may decrease the thickness of TiN film and increase the density of the TiN films. Furthermore, as the ALA treatment time increases from sample S1 to sample S4, the film thickness decreases, and the film density increases. For example, the sample S4 deposited with the longest ALA treatment time, has the lowest film thickness and the highest film density. It may be concluded that the increase in ALA treatment time may decrease the film thickness and increase the film density. In FIG. 6C, with the ALA treatment, the film thickness of the titanium nitride layer may be changed from about 26.4 nanometers to about 26.6 nanometers to a range from about 25.2 nanometers to about 26.3 nanometers. In FIG. 6C, with the ALA treatment, the density of the titanium nitride layer may be changed from about 4.9 g/cm$^3$ to about 5 g/cm$^3$ to a range from about 5 g/cm$^3$ to about 6 g/cm$^3$. For example, the density of the ALA treated titanium nitride layer is in a range from 5.1 g/cm$^3$ to 5.4 g/cm$^3$. The increase in the film density also suggests the improvement of the crystallinity of TiN layers.

Figure 7:
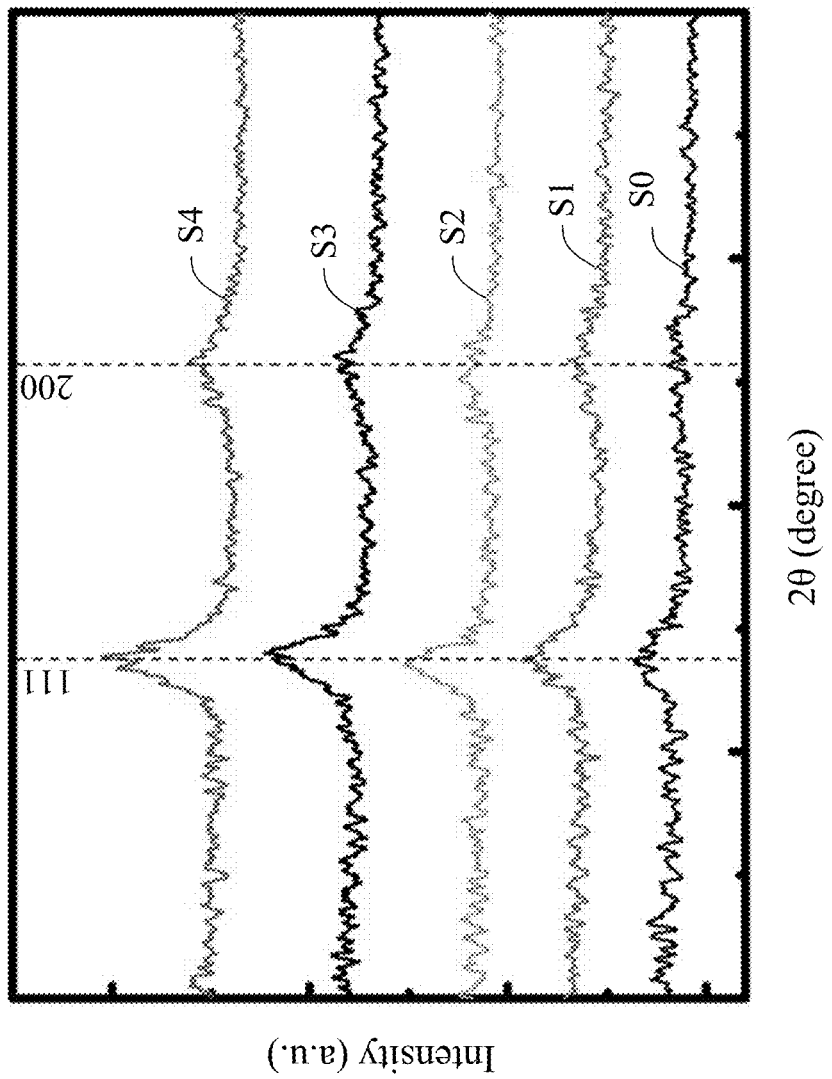
FIG. 7 shows the results of various deposited TiN films under grazing incidence X-ray diffraction (GIXRD) according to some embodiments of the present disclosure.

FIG. 7 shows the grazing incidence X-ray diffraction (GIXRD) results of various deposited TiN films according to some embodiments of the present disclosure. In FIG. 7, the 2θ is shown on the horizontal axis, and an intensity is shown on the vertical axis. Two XRD peaks can be attributed to the diffraction from the (111) and (200) crystallographic planes in the face-centered cubic TiN layer/structure. As confirmed in FIG. 7, the diffraction intensity increases as the ALA treatment time increases from sample S0 to sample S4, which indicates the improvement in the crystallinity of the TiN film with the increase of the ALA treatment time.

One can see that the crystallinity of the TiN layers was enhanced by an increase in the ALA treatment time. An annealing process can give rise to a decrease in the thin film thickness, an increase in the film density, and an improvement of the crystallinity as a result of the grain coalescence for suppression of grain boundaries and defects. Therefore, one could deduce that the ALA treatment equivalently contributes to an annealing effect. An increase in the ALA treatment time provides more energy from the plasma into the film, leading to a further enhancement of the crystalline quality together with an increase/decrease of the film density/thickness of the TiN layers. The mechanism behind the ALA process is the energy delivered from the energetic ions or radicals in the Ar plasma to the sample surface, resulting in the increase in adatom migration and surface temperature. In addition, the increase in the surface temperature promotes the chemical reaction between the surface species with the subsequent precursors. The improvement in crystallinity and the increase in film density may also imply the change in the stoichiometry of the TiN layers.

Figure 8:
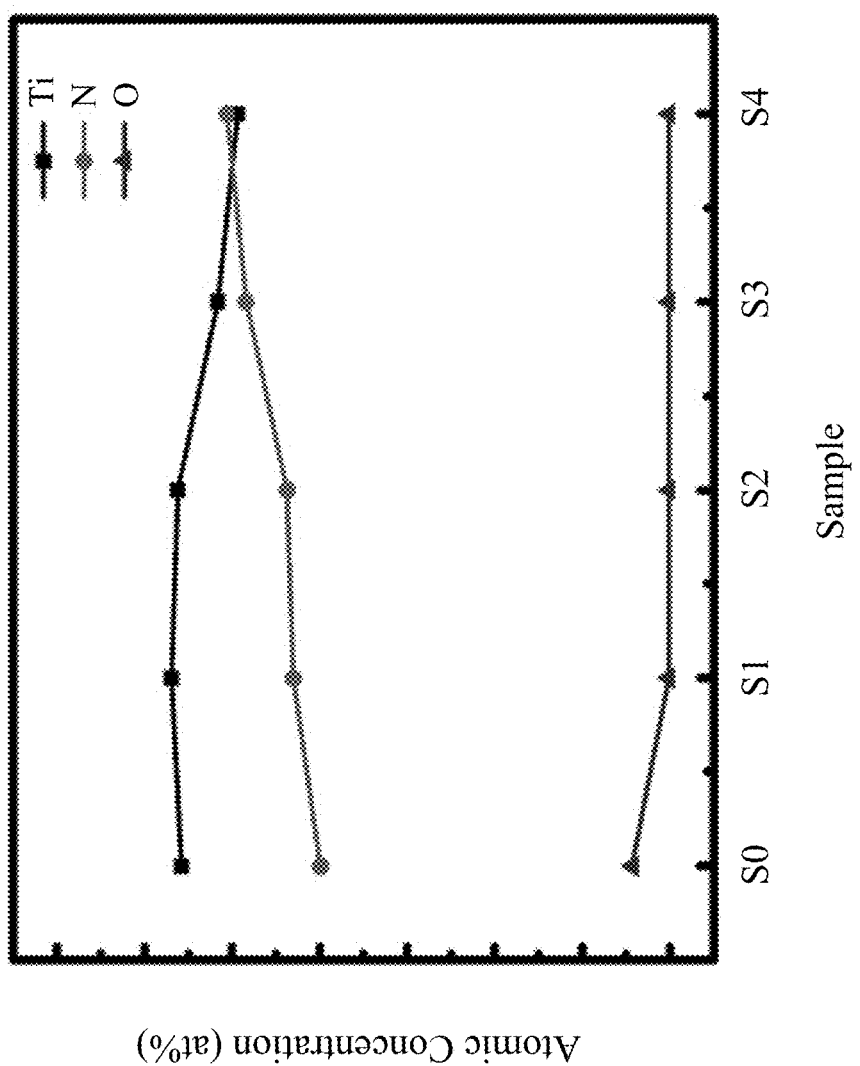
FIG. 8 shows the stoichiometry of various deposited TiN films according to some embodiments of the present disclosure.

FIG. 8 shows atomic stoichiometry of various deposited TiN films according to some embodiments of the present disclosure. In FIG. 8, an atomic concentration is shown on the vertical axis. Comparing the samples S1-S4 with the sample S0, it can be observed that the samples S1-S4 have higher nitrogen atomic concentrations than that of the sample S0. This indicates that the ALA treatment may increase the atomic concentration of nitrogen (N) in the TiN film. The ALA treatment also leads to neglectable oxygen contents in the TiN layer, which can be ascribed to the film densification and the surface treatment that removes the contamination and oxidation layer at the surface. ALA treatment leads to an impact on the stoichiometry of the TiN layers. In FIG. 8, with the ALA treatment, a nitrogen atomic concentration of the titanium nitride layer is in a range from 43% to 55%, and an oxygen atomic concentration of the titanium nitride layer is less than 1%.

Furthermore, as the ALA treatment time increases from sample S1 to sample S4, the nitrogen atomic concentration increases. For example, for sample S4, a ratio of the titanium atomic concentration of titanium to the nitrogen may be in a range from 0.8 to 1.2. This indicates that the ALA treatment time may be controlled to adjust the stoichiometry of the TiN film to approach a one-to-one ratio of titanium and nitrogen.

Figure 9:
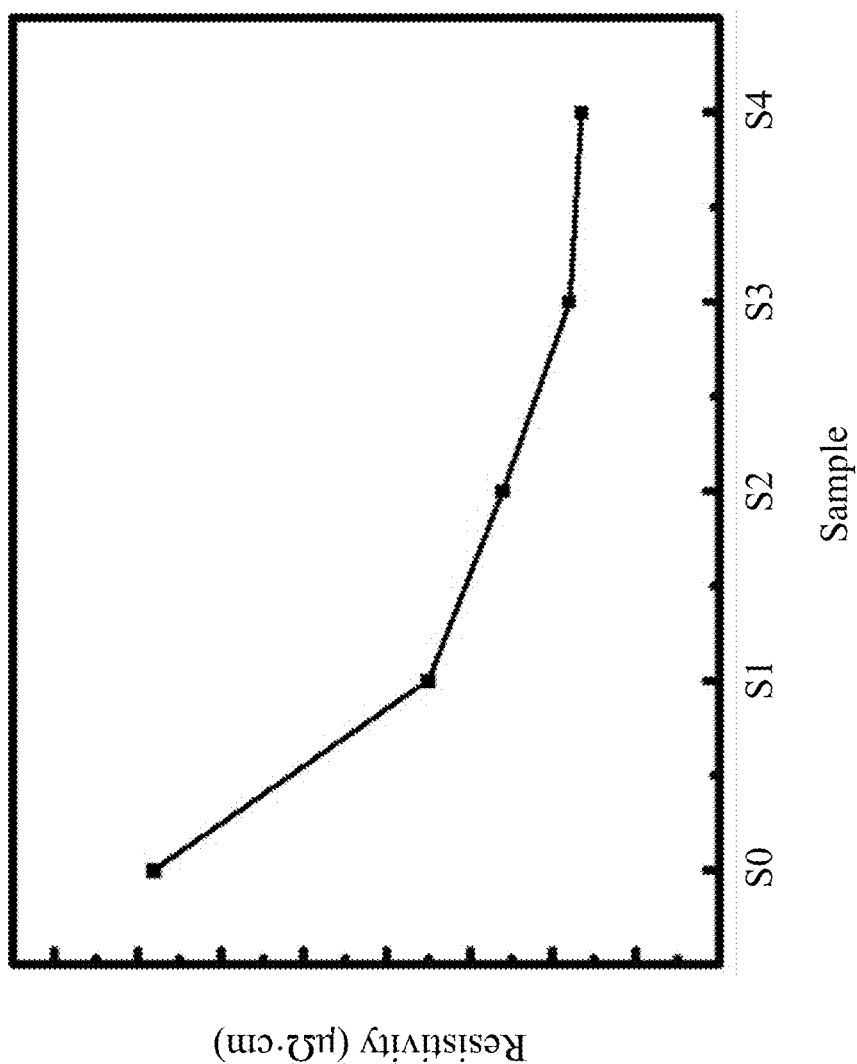
FIG. 9 shows the resistivity of various deposited TiN films according to some embodiments of the present disclosure.

FIG. 9 shows the resistivity of various deposited TiN films according to some embodiments of the present disclosure. In FIG. 9, the resistivity is shown on the vertical axis. Comparing the samples S1-S4 with the sample S0, it can be observed that the samples S1-S4 have much lower resistivities than that of the sample S0. This indicates that the ALA treatment may reduce the resistivity of the deposited TiN film. Furthermore, in FIG. 9, as the ALA treatment time increases from sample S1 to sample S4, the resistivity decreases from sample S1 to sample S4. This indicates that the increase in ALA treatment time can further reduce the resistivity of the deposited TiN film. In FIG. 9, with the ALA treatment, the resistivity of the titanium nitride layer is in a range from 100 μΩ·cm to 400 μΩ·cm. For example, the resistivity of the titanium nitride layer is in the range from 100μΩ·cm to 300 μΩ·cm.

Figure 10:
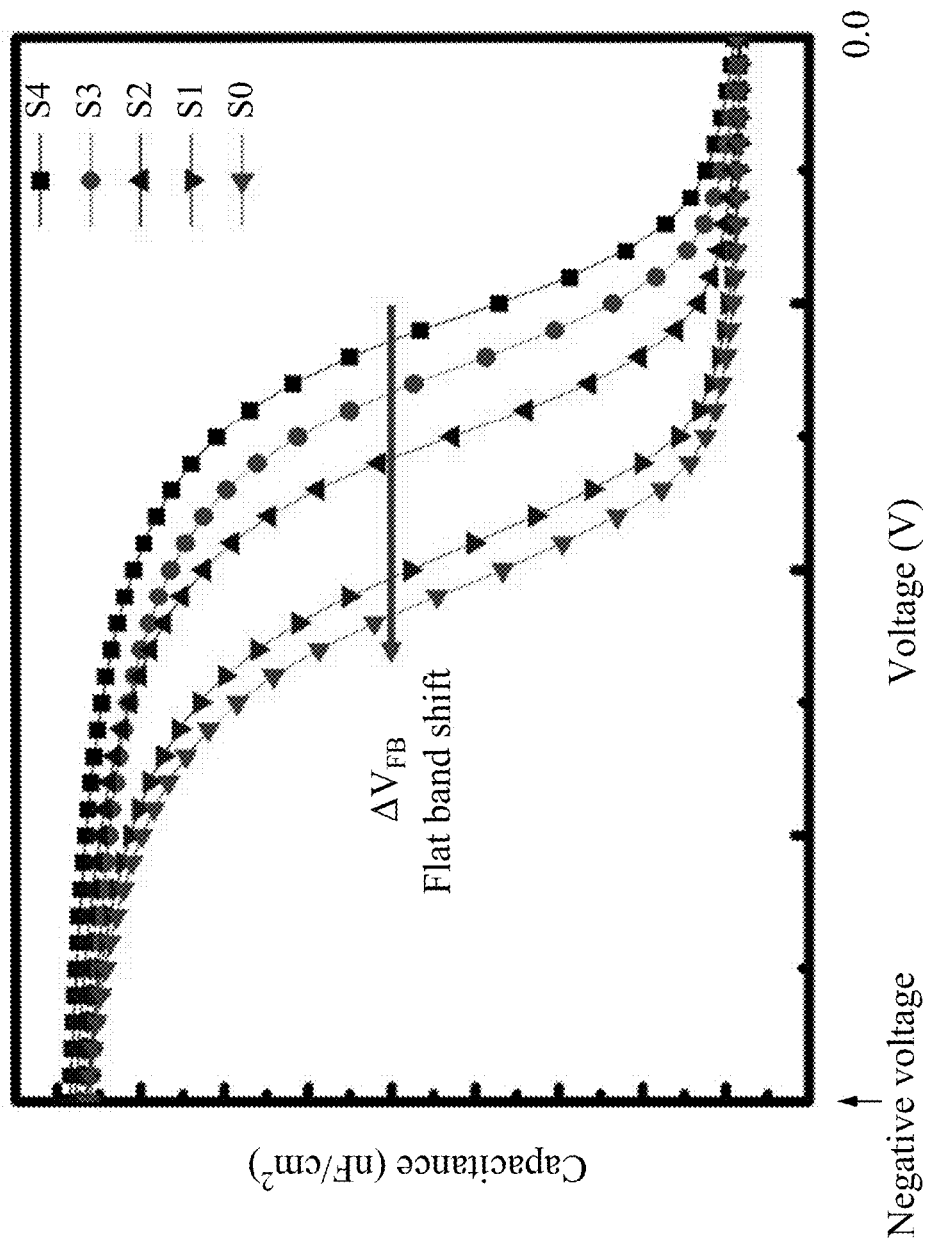
FIG. 10 shows the capacitance versus voltage (C-V) curve of NMOS devices with various deposited TiN films according to some embodiments of the present disclosure.

FIG. 10 shows the capacitance versus voltage (C-V) curve of the TiN/SiO$_2$/p-type Si metal-oxide-semiconductor (MOS) capacitors with various deposited TiN films according to some embodiments of the present disclosure. In FIG. 10, the voltage is shown on the horizontal axis, and the capacitance is shown on the vertical axis. The left region corresponds to an accumulation region, and the right region corresponds to a deplete/inversion region. In the present embodiments, the SiO$_2$ layer of the samples S0-S4 are kept at substantially the same thickness. With the increase of the ALA treatment time, as indicated by the arrow in the figure, the C-V curves reveal a negative shift of the flat band voltage ($V_{FB}$). The shift of $V_{FB}$ is correlated with the variation of the work function of the TiN metal gate according to the following equation:

$$V_{FB} = (\phi_m - \phi_s) - \frac{Q_F}{\varepsilon_{ox}} EOT$$

where $\phi_m$ and $\phi_s$ are the metal work function and the semiconductor work function, respectively, in volts, $Q_F$ is the oxide fixed charge, and $\varepsilon_{ox}$ is the dielectric constant of the SiO$_2$ layer. EOT is the equivalent oxide thickness of the SiO$_2$ layer, which is determined by the maximum capacitance of the MOS device biased in the accumulation region. The equation shows a linear dependence of $V_{FB}$ on EOT with an intercept of $\phi_m - \phi_s$ if the ALA process does not cause an alteration of $Q_F$ and $\varepsilon_{ox}$. Hence, once the $V_{FB}$, $\phi_s$, and EOT are known from the C-V measurements, the $\phi_m$ of the TiN layer can be obtained. As a result, a shift of the $V_{FB}$ toward a negative voltage direction, as shown in FIG. 10, is ascribed to the decrease of the TiN work function by the ALA treatment. The EOT and the capacitance can be known from the following equation:

$$\frac{1}{C_{max}} = \frac{1}{C_{ox}} = \frac{EOT}{\varepsilon_{ox}}$$

$C_{max}$ is the maximum capacitance in the accumulation region. $C_{ox}$ is the oxide capacitance per unit area. Thus, EOT can be known from the C-V measurements.

Figure 11:
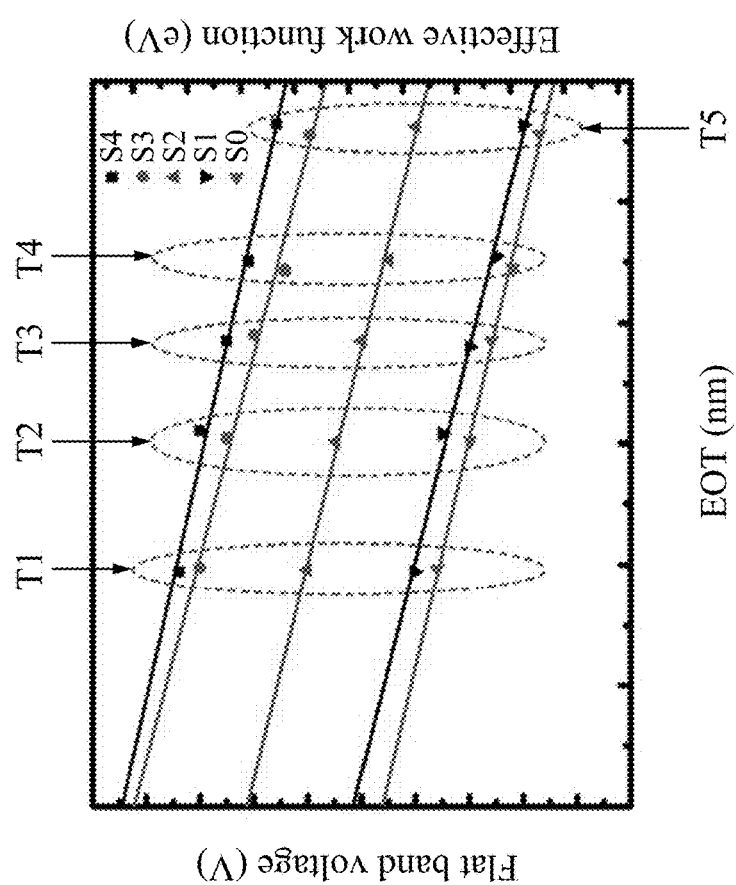
FIG. 11 shows flat band voltage versus equivalent oxide thickness (EOT) of various deposited TiN films according to some embodiments of the present disclosure.

FIG. 11 shows the flat band voltage ($V_{FB}$) versus EOT of MOS capacitors with various deposited TiN films according to some embodiments of the present disclosure. In FIG. 11, the EOT is shown on the horizontal axis, and $V_{FB}$ is shown on the vertical axis. By designing various MOS capacitors with the SiO$_2$ gate dielectric layer 122 (referring to FIG. 1) having various thicknesses and measuring C-V curves, a dependency of $V_{FB}$ on EOT can be obtained. The linear relationship between $V_{FB}$ and EOT is in good agreement with the above equation. For example, a linear fit can be applied to the data and is extrapolated to zero oxide thickness. The intercept and the slope of the fitting curves give $\phi_m - \phi_s$ and $Q_F/\varepsilon_{ox}$, respectively. As $\phi_s$ is constant for the MOS capacitors, the effective metal work function $\phi_m$ can be obtained and is labeled on the right vertical axis.

In the present embodiments, groups T1-T5 of data are indicated for their respective oxide thickness. The NMOS devices of the first group T1 have a first oxide thickness, and the C-V curves are shown in FIG. 10. The NMOS devices of the second to fifth groups T2-T5 have second to fifth oxide thickness, respectively, and the C-V curves are measured but not shown. The first to fifth oxide thickness increases in a sequence.

Figure 12:
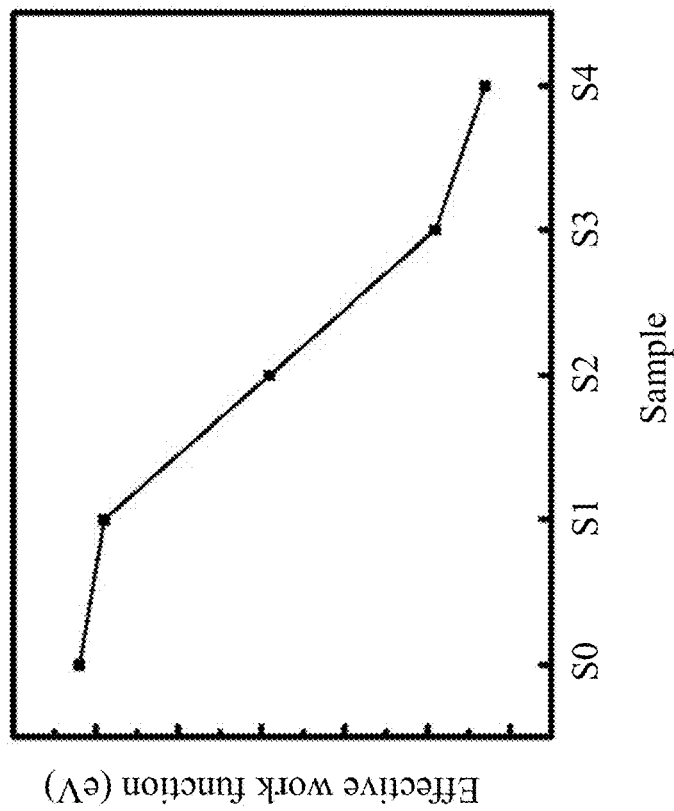
FIG. 12 shows the effective work function of various deposited TiN films according to some embodiments of the present disclosure.

FIG. 12 shows the effective work function of various deposited TiN films according to some embodiments of the present disclosure. In FIG. 12, the effective work function ($\phi_m$) is shown on the vertical axis. It is confirmed in FIG. 12 that the ALA treatment can decrease the TiN work function. Furthermore, when the ALA treatment time increases, the TiN work function significantly decreases. The decrease in the work function can be attributed to the increase in the nitrogen concentration in the TiN layer, as shown in FIG. 6C.

In addition, crystallinity may be another factor for the variation of the work function of the TiN metal gate, as shown in FIG. 7. For example, the TiN grain with (111) plane and amorphous phase have a first work function value (e.g., from about 4.5 eV to about 4.8 eV), and the TiN grain with (200) plane has a second work function value (e.g., from about 2.8 eV to about 3.1 eV) less than the first work function value. Hence, the predominant (111) XRD peak may account for the high work function of about 4.5 eV to about 4.7 eV, which were experimentally observed in polycrystalline TiN layers deposited on SiO$_2$. As the ALA treatment time increases, the crystallinity of the TiN layer is improved along with the suppression of the amorphous phase. Hence the proportion of the (200) grains increases in the TiN layer. As a result, the improved crystallinity by the increase of the ALA treatment time also contributes to the decrease of the work function of the TiN metal gate.

FIGS. 13-21B illustrate perspective views and cross-sectional views of intermediate stages in the formation of a multi-gate device 400 in accordance with some embodiments of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device (e.g., multi-bridge-channel field-effect transistor (MBCFET)). The channel region may be referred to as a "nanowire," which as used herein includes channel regions of various geometries (e.g., cylindrical, bar-shaped) and various dimensions. It is understood that additional steps may be provided before, during, and after the steps shown in FIGS. 13-21B, and some of the steps described below can be replaced or eliminated for additional embodiments of the method. The order of the operations/processes may be interchangeable.

Figure 13:
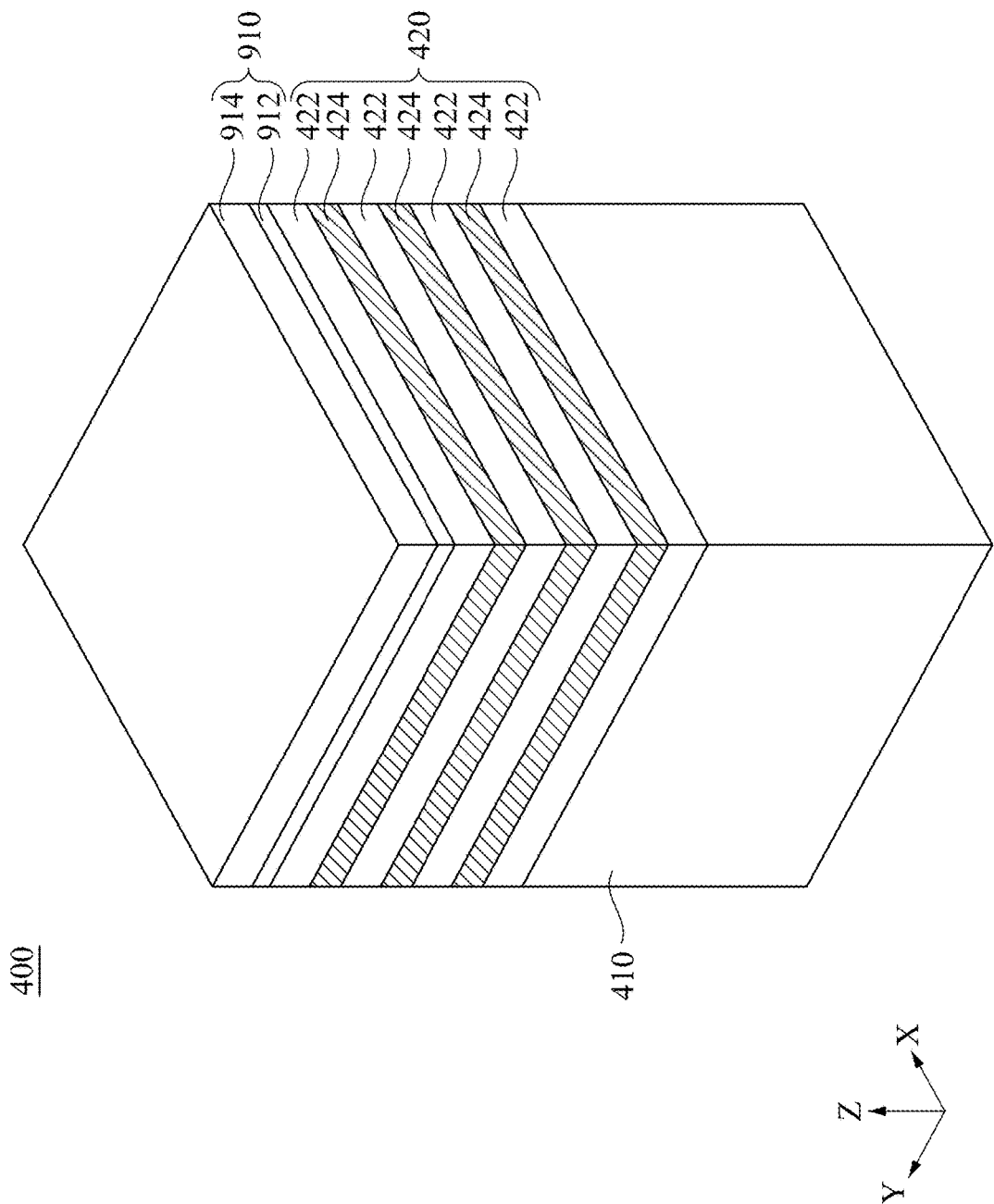

Reference is made to FIG. 13, where one or more epitaxial layers are grown on a substrate, thereby forming an epitaxial stack 220 over a substrate 210. In some embodiments, the substrate 410 may include silicon (Si). Alternatively, the substrate 410 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 410 may include a semiconductor-on-insulator (SOI) structure such as a buried dielectric layer. Also alternatively, the substrate 410 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 420 includes epitaxial layers 422 of a first composition interposed by epitaxial layers 424 of a second composition. The first and second compositions can be different. In some embodiments, the epitaxial layers 422 are SiGe and the epitaxial layers 424 are silicon (Si). However, other embodiments are possible including those that provide for a first composition and a second composition having different oxidation rates and/or etch selectivity. In some embodiments, the epitaxial layers 422 include SiGe and where the epitaxial layers 424 include Si, the Si oxidation rate of the epitaxial layers 424 is less than the SiGe oxidation rate of the epitaxial layers 422.

The epitaxial layers 424 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 422 may also be referred to as sacrificial layers, and epitaxial layers 424 may also be referred to as channel layers. The use of the epitaxial layers 424 to define a channel or channels of a device is further discussed below.

It is noted that three layers of the epitaxial layers 422 and three layers of the epitaxial layers 424 are alternately arranged as illustrated in FIG. 13, which is for illustrative purposes only and not intended to be limiting beyond what is specifically recited in the claims. It can be appreciated that any number of epitaxial layers can be formed in the epitaxial stack 420; the number of layers depends on the desired number of channels regions for the transistor. In some embodiments, the number of epitaxial layers 424 is between 2 and 10.

By way of example, epitaxial growth of the layers of the stack 420 may be performed by a molecular beam epitaxy (MBE) process, a metalorganic chemical vapor deposition (MOCVD) process, and/or other suitable epitaxial growth processes. In some embodiments, the epitaxially grown layers such as the epitaxial layers 424 include the same material as the substrate 410. In some embodiments, the epitaxially grown layers 422 and 424 include a different material than the substrate 410. As stated above, in at least some examples, the epitaxial layers 422 include an epitaxially grown silicon germanium (SiGe) layer, and the epitaxial layers 424 include an epitaxially grown silicon (Si) layer. Alternatively, in some embodiments, either of the epitaxial layers 422 and 424 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 422 and 424 may be chosen based on providing differing oxidation and/or etching selectivity properties. In some embodiments, the epitaxial layers 422 and 424 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 14:
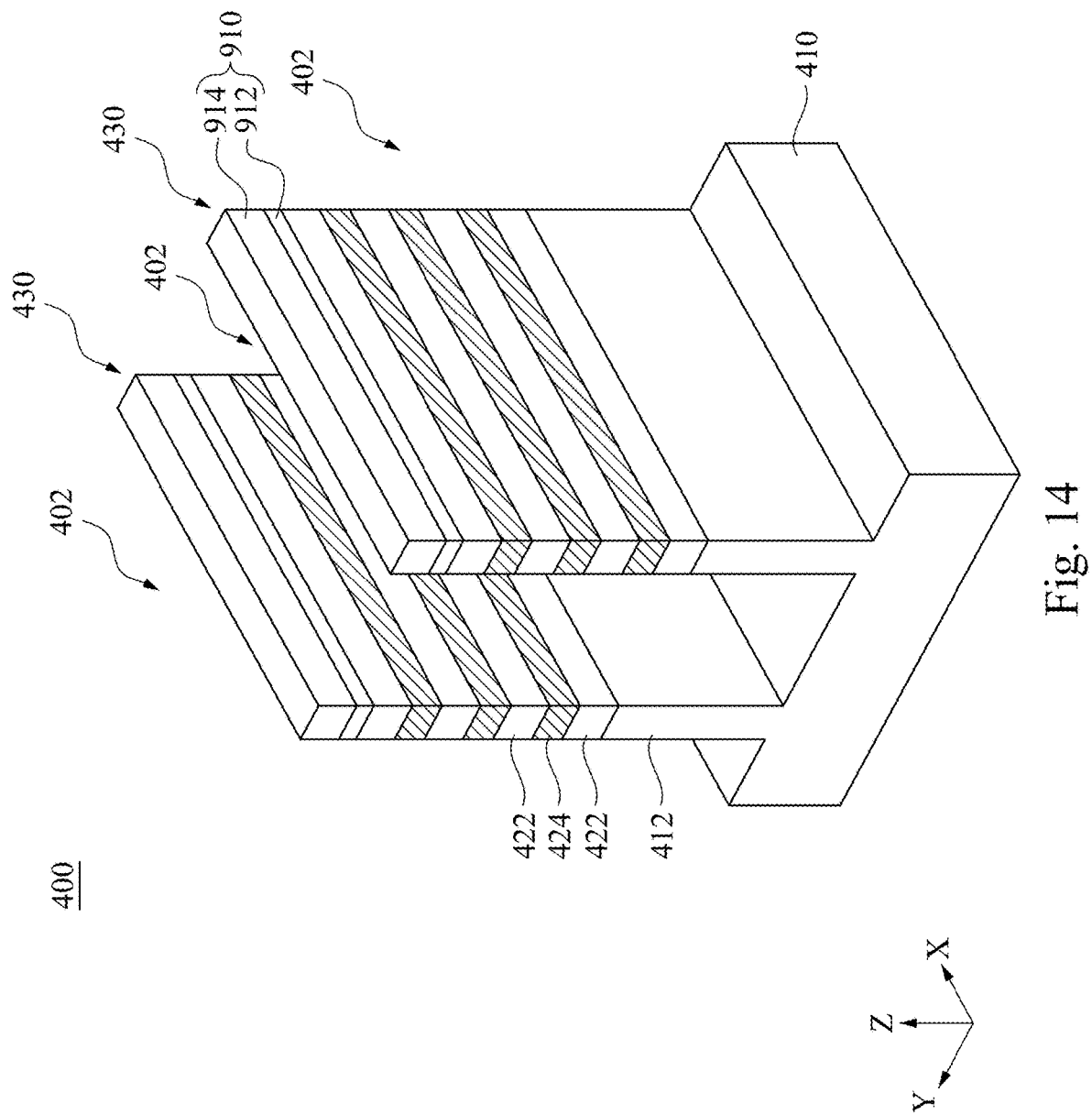

Reference is made to FIG. 14. The epitaxial stack 420 and the substrate 410 are patterned to form plural semiconductor fins 430. In various embodiments, each of the semiconductor fins 430 includes a substrate portion 412 formed from the substrate 410 and portions of each of the epitaxial layers of the epitaxial stack including epitaxial layers 422 and 424. The semiconductor fins 430 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 430 by etching the initial epitaxial stack 420. The etching process can include dry etching, wet etching, reactive ion etching (RIE), and/or other suitable processes.

In the illustrated embodiments as illustrated in FIGS. 13 and 14, a hard mask (HM) layer 910 is formed over the epitaxial stack 420 prior to the formation of the semiconductor fins 130. In some embodiments, the HM layer includes an oxide layer (e.g., a pad oxide layer that may include $SiO_2$) 912 and a nitride layer (e.g., a pad nitride layer that may include $Si_3N_4$) 914 formed over the oxide layer. The oxide layer may act as an adhesion layer between the epitaxial stack and the nitride layer and may act as an etch stop layer for etching the nitride layer. In some examples, the HM oxide layer includes thermally grown oxide, chemical vapor deposition (CVD)-deposited oxide, and/or atomic layer deposition (ALD)-deposited oxide. In some embodiments, the HM nitride layer is deposited on the HM oxide layer by CVD and/or other suitable techniques.

The semiconductor fins 430 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. The patterned mask may then be used to protect regions of the semiconductor substrate 410, and layers formed thereupon, while an etch process forms trenches 402 in unprotected regions through the HM layer 910, through the epitaxial stack 420, and into the substrate 410, thereby leaving the plurality of extending fins 430. The trenches 402 may be etched using a dry etch (e.g., reactive ion etching), a wet etch, and/or a combination thereof. Numerous other embodiments of methods to form the fins on the substrate may also be used including, for example, defining the fin region (e.g., by mask or isolation regions) and epitaxially growing the epitaxial stack 420 in the form of the semiconductor fins 430.

Figure 15:
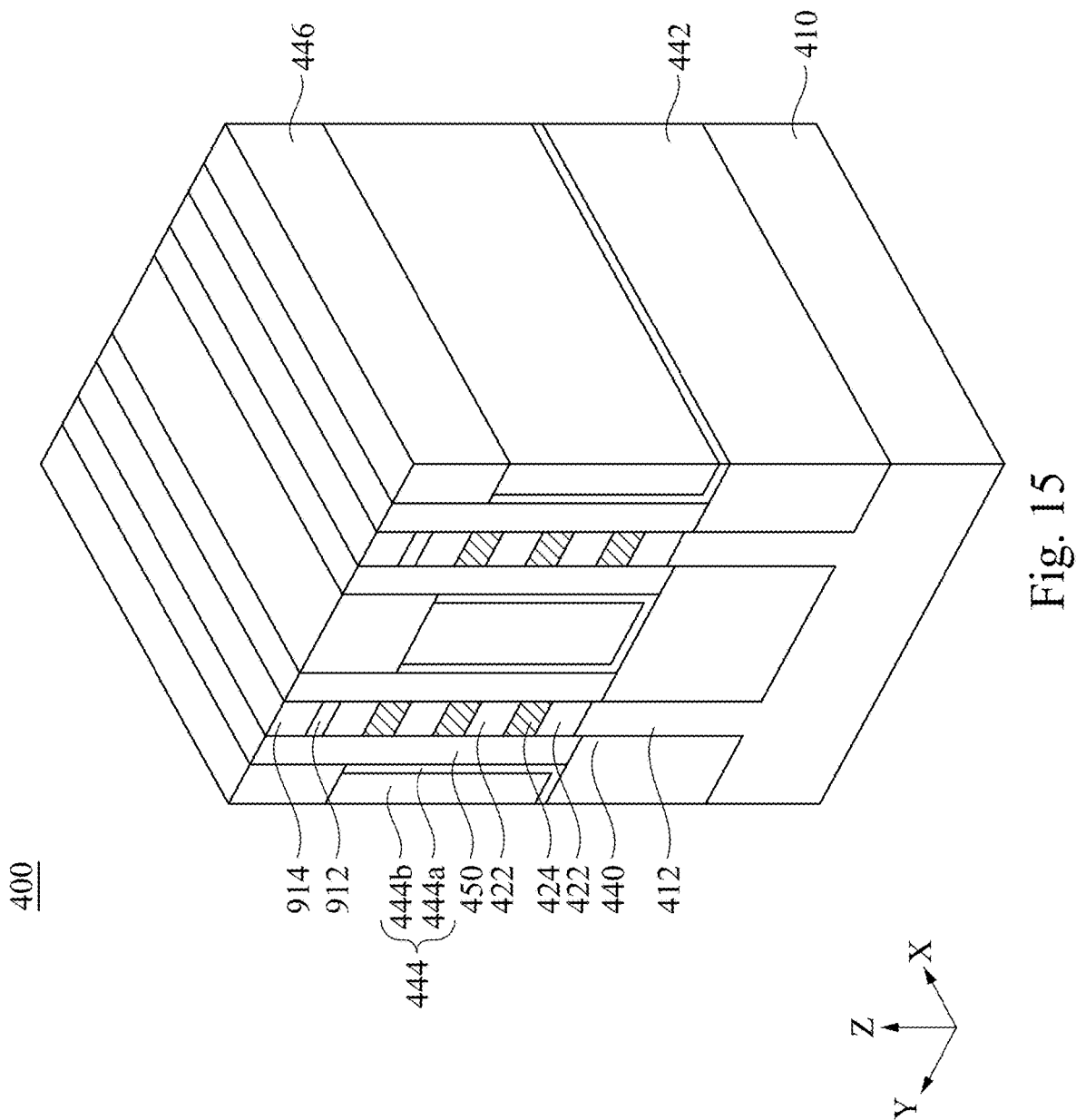

Reference is made to FIG. 15. Shallow trench isolation (STI) features 442 are formed interposing the semiconductor fins 130. By way of example and not limitation, a dielectric layer is first deposited over the substrate 410, filling the trenches 402 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable processes. In some embodiments, after deposition of the dielectric layer, the structure may be annealed, for example, to improve the quality of the dielectric layer. In some embodiments, the dielectric layer (and subsequently formed STI features 442) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 functions as a CMP stop layer. The STI features 442 interposing the fins 430 are recessed, providing the fins 430 extending above the STI features 442. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fins 430. In the illustrated embodiments, the desired height exposes each of the layers of the epitaxial stack 420 in the fins 430.

Sacrificial epitaxial structures 450 may be over the respective fins 430 and STI features 442. In some embodiments, the sacrificial epitaxial structures 450 are of the same composition as the epitaxial layers 422 in the fins 430 and thus different composition than the epitaxial layers 424 in the fins 430. Therefore, the sacrificial epitaxial structures 450 and the epitaxial layers 422 can be removed together in the following channel release step. By way of example and not limitation, the sacrificial epitaxial structures 450 are SiGe. In some embodiments, the sacrificial epitaxial structures 450 may be cladding epitaxial structures formed using one or more epitaxy or epitaxial (epi) processes, such that SiGe features and/or other suitable features can be formed in a crystalline state on the fins 430. The epitaxy processes include CVD deposition techniques (e.g., vapor-phase epitaxy (VPE) and/or ultra-high vacuum CVD (UHV-CVD)), molecular beam epitaxy, and/or other suitable processes.

Dielectric fin structures 444 are formed over the STI features 442 and interposing the semiconductor fins 430. In some embodiments, a dielectric layer is conformally formed, and a filling material is filled in the trenches 402. A planarization (e.g., CMP) process is then performed to remove excess portions of the dielectric layer and the filling material to form the dielectric fin structures 444 respectively in the trenches 402. As such, each of the dielectric fin structures 444 includes a dielectric layer 444a and a filling dielectric fin 444b above the dielectric layer 444a. In some embodiments, the dielectric layer 444a is deposited with an ALD process or other suitable processes. In some embodiments, the dielectric layer 444a and the filling dielectric fin 444b include silicon nitride, silicon oxide, silicon oxynitride, SiCN, SiCON, SiOC, or other suitable materials. For example, the dielectric layer 444a includes silicon nitride, and the filling dielectric fin 444b includes silicon dioxide.

Figures 17A, 17B:
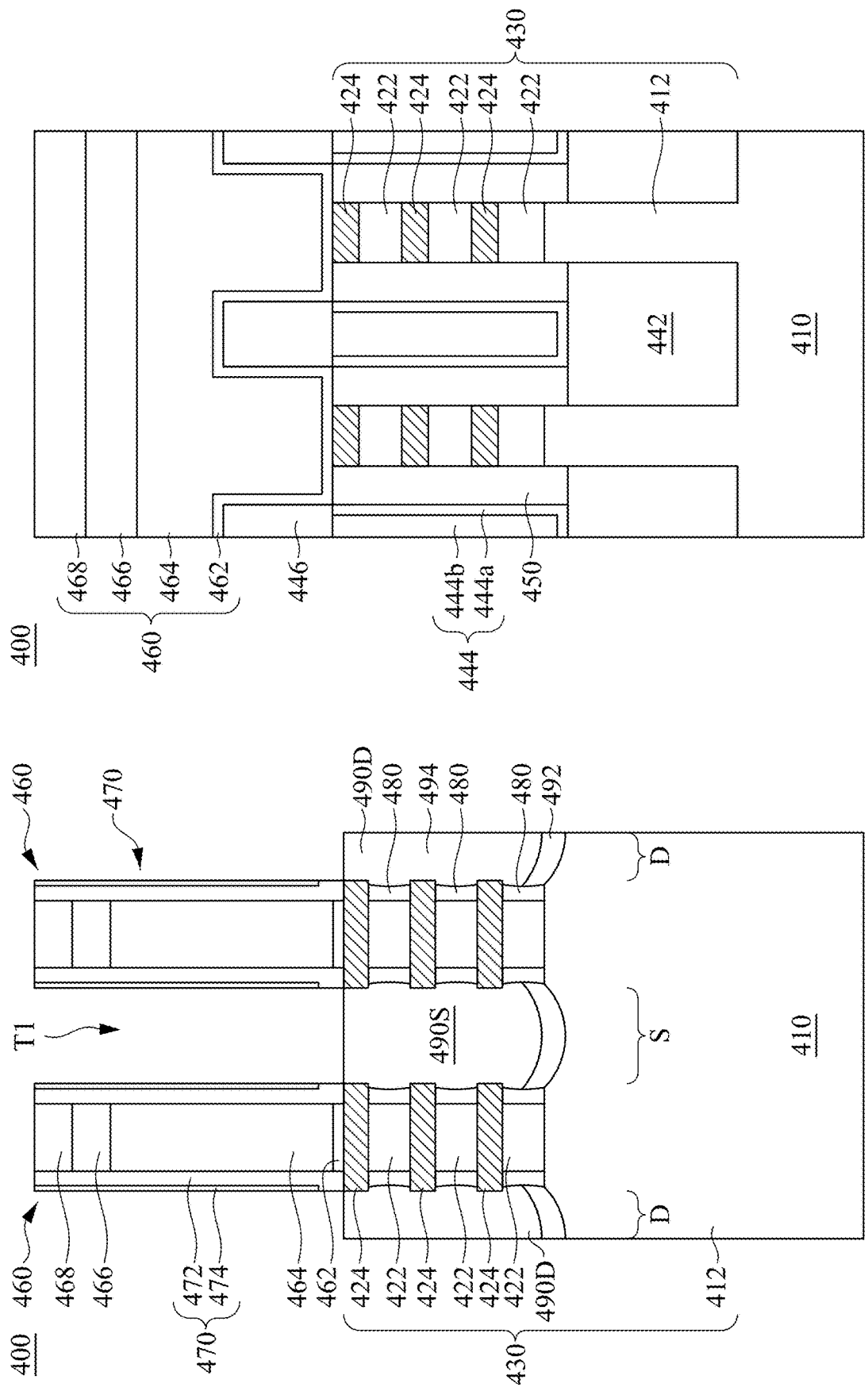

The dielectric fin structures 444 are configured to limit the space for epitaxially growing the source/drain epitaxial structures 490S/490D (referring to FIG. 17A). As a result, the source/drain epitaxial structures 490S/490D (referring to FIG. 17A) are confined between the dielectric fin structures 444. This can be used to produce any desirable size of the source/drain epitaxial structures 490S/490D (referring to FIG. 17A), for reducing parasitic capacitances.

In some embodiments, the dielectric fin structures 444 may be recessed by a suitable etching process. The recessed dielectric fin structures 444 may have a top surface substantially level with the top surface of the stack 420, or may be at an intermediate level between the top surface and the bottom surface of the topmost epitaxial layer 424. In some embodiments, dielectric caps 446 are then respectively formed on the recessed dielectric fin structures 444. In some embodiments, the dielectric caps 446 are formed of silicon nitride, silicon oxynitride, silicon carbide, silicon carbonitride, or the like. For example, a dielectric cap material is formed above the recessed dielectric fin structures 444, and a planarization (e.g., CMP) process is performed to remove the excess portion of the dielectric cap material to form the dielectric caps 446.

Figure 16A:
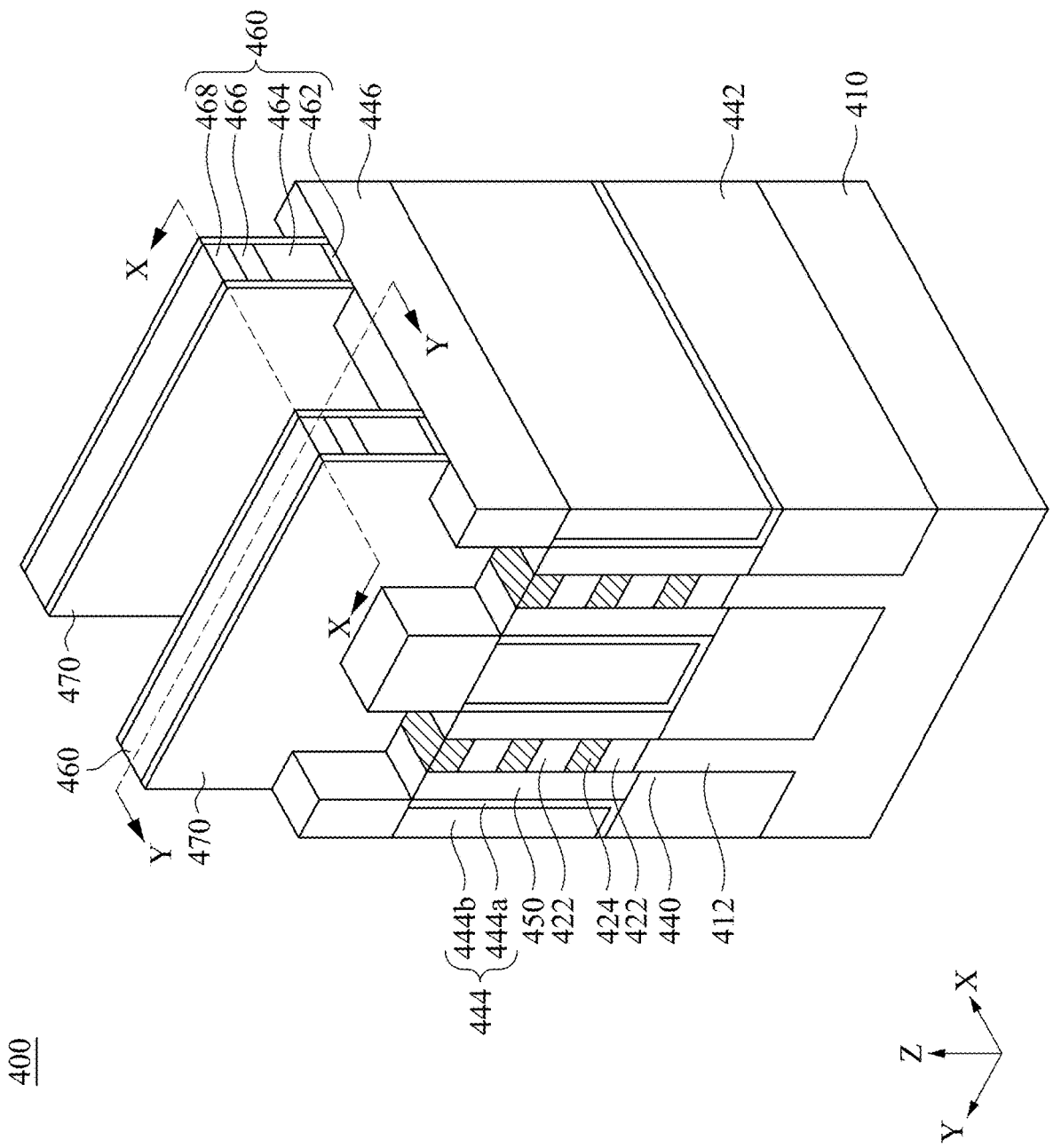
Figures 16B, 16C:
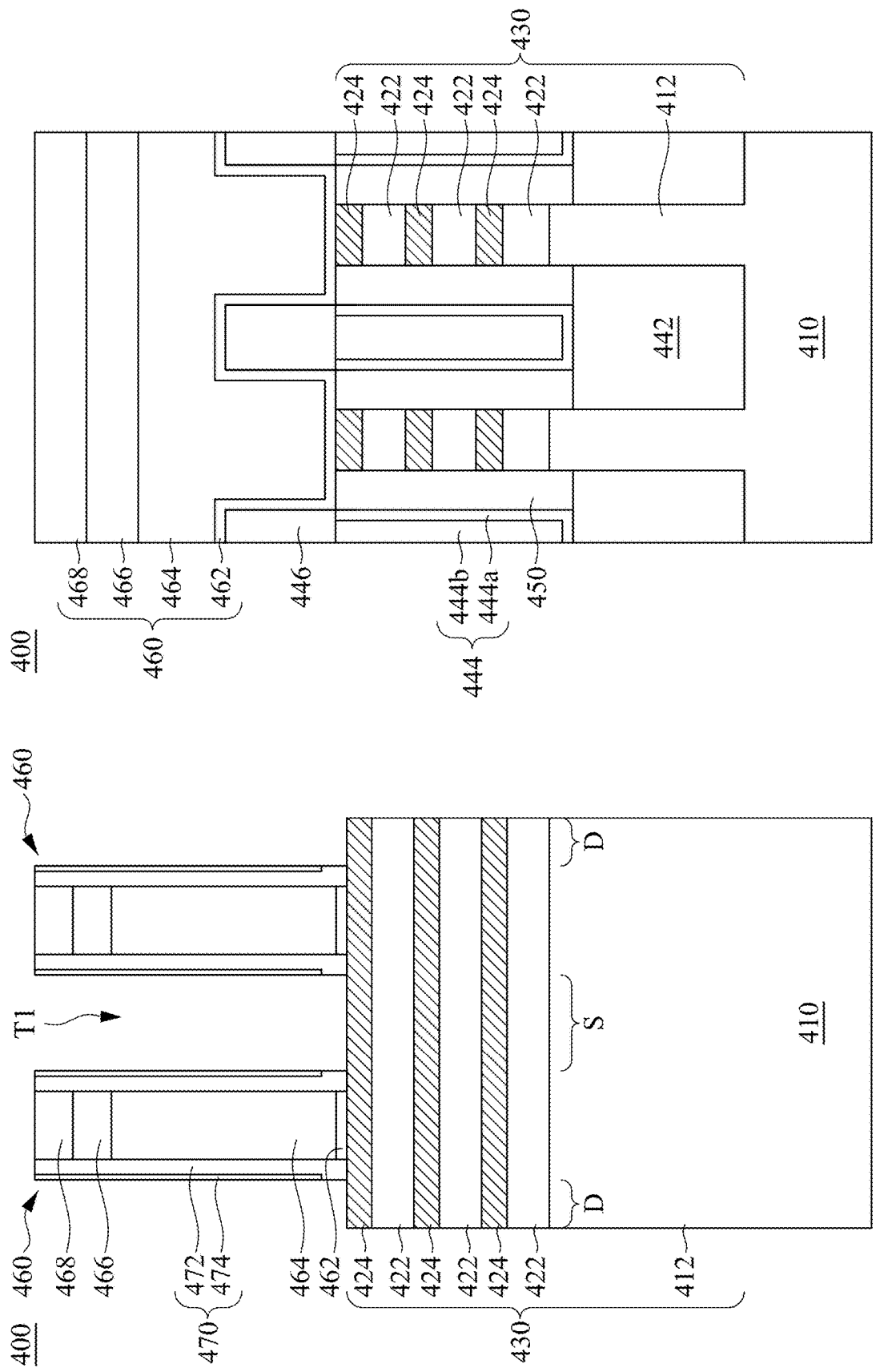

Reference is made to FIGS. 16A-16C. FIG. 16B is a cross-sectional view taken along the line X-X in FIG. 16A. FIG. 16C is a cross-sectional view taken along the line Y-Y in FIG. 16A. A gate structure 460 is formed. In some embodiments, the gate structure 460 is a dummy (sacrificial) gate structure that is subsequently removed. Thus, in some embodiments using a gate-last process, the gate structure 460 is a dummy gate structure and will be replaced by the final gate structure at a subsequent processing stage of the structure. In particular, the dummy gate structure 460 may be replaced at a later processing stage by a high-k dielectric layer (HK) and a metal gate electrode (MG) as discussed below. While the present discussion is directed to a replacement gate process whereby a dummy gate structure is formed and subsequently replaced, other configurations may be possible.

In some embodiments, the dummy gate structure 460 is formed over the substrate 410 and is at least partially disposed over the fins 430. The portion of the fins 430 underlying the dummy gate structure 460 may be referred to as the channel region. The dummy gate structure 460 may also define a source/drain region S/D of the fins 430, for example, the regions of the fin 430 adjacent and on opposing sides of the channel region. In some embodiments, prior to the formation of the dummy gate structure 460, the HM layer 910, a topmost layer 122, and top portions of the sacrificial epitaxial structures 450 may be removed.

In the illustrated embodiments, a dummy gate dielectric layer 462 is first formed over the fins 130. In some embodiments, the dummy gate dielectric layer 462 may include $SiO_2$, silicon nitride, a high-k dielectric material and/or other suitable material. In various examples, the dummy gate dielectric layer 462 may be deposited by a CVD process, a subatmospheric CVD (SACVD) process, a flowable CVD process, an ALD process, a PVD process, or other suitable processes. By way of example, the dummy gate dielectric layer 462 may be used to prevent damages to the fins 430 by subsequent processes (e.g., subsequent formation of the dummy gate structure). Subsequently, a dummy gate electrode layer 464 and a hard mask which may include multiple layers (e.g., an oxide layer 466 and a nitride layer 468) are formed. In some embodiments, the dummy gate structure 460 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure, for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 464 may include polycrystalline silicon (polysilicon). In some embodiments, the hard mask includes an oxide layer 466 such as a pad oxide layer that may include $SiO_2$, and a nitride layer 456 such as a pad nitride layer that may include $Si_3N_4$ and/or silicon oxynitride. In some embodiments, after patterning the dummy gate electrode layer 464, the dummy gate dielectric layer 462 is removed from the S/D regions of the fins 430. The etch process may include a wet etch, a dry etch, and/or a combination thereof. The etch process is chosen to selectively etch the dummy gate dielectric layer 462 without substantially etching the fins 430, the dummy gate electrode layer 464, the oxide layer 466, and the nitride layer 468.

Gate sidewall spacers 470 are formed on sidewalls of the dummy gate structures 460. In some embodiments, a spacer material layer is deposited on the substrate, for example, on top and sidewalls of the dummy gate structure 460. The spacer material layer may be a conformal layer that is subsequently etched back to form gate sidewall spacers. The spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers. By way of example, the spacer material layer may be formed by depositing a dielectric material over the gate structure 150 using processes such as a CVD process, a subatmospheric CVD (SACVD) process, a flowable CVD process, an ALD process, a PVD process, or other suitable processes. An anisotropic etching process is then performed on the deposited spacer material layer to expose portions of the fins 430 not covered by the dummy gate structure 460 (e.g., in source/drain regions of the fins 430). Portions of the spacer material layer directly above the dummy gate structure 460 may be completely removed by this anisotropic etching process. Portions of the spacer material layer on sidewalls of the dummy gate structure 460 may remain, forming gate sidewall spacers, which are denoted as the gate sidewall spacers 470, for the sake of simplicity. It is noted that although the gate sidewall spacers 470 are multi-layer structures (e.g. first spacer 472 and second spacer 478) in the cross-sectional view of FIG. 16B, they are illustrated as single-layer structures in the perspective view of FIG. 16A for the sake of simplicity.

Reference is made to FIGS. 17A and 17B. Exposed portions of the semiconductor fins 430 that extend laterally beyond the gate sidewall spacers 470 (e.g., in source/drain regions of the fins 430) are etched by using, for example, an anisotropic etching process that uses the dummy gate structure 460 and the gate sidewall spacers 470 as an etch mask, resulting in recesses into the semiconductor fins 430 and between corresponding dummy gate structures 460. After the anisotropic etching, the end surfaces of the sacrificial layers 422 and channel layers 424 are aligned with the respective outermost sidewalls of the gate sidewall spacers 470, due to the anisotropic etching. In some embodiments, the anisotropic etching may be performed by a dry chemical etch. The sacrificial layers 422 may be further laterally recessed, and inner spacers 480 are formed on opposite end surfaces of the laterally recessed sacrificial layers 422.

Source/drain epitaxial structures 490S/490D are formed in the recesses in the fins 430. In greater detail, the source epitaxial structure 490S is formed in the recessed source region S of the fin 430, and drain epitaxial structure 490D is formed over the drain region D of the fin 430. The source/drain epitaxial structures 490S/490D may be formed by performing an epitaxial growth process that provides an epitaxial material on the fins 430. During the epitaxial growth process, the dummy gate structures 460 and gate sidewall spacers 470 limit the source/drain epitaxial structures 490S/490D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 430 and the channel layers 424.

In some embodiments, the source/drain epitaxial structures 490S/490D may include Ge, Si, GaAs, AlGaAs, SiGe, GaAsP, SiP, or other suitable material. The source/drain epitaxial structures 490S/490D may be in-situ doped during the epitaxial process by introducing doping species including p-type dopants, such as boron; n-type dopants, such as phosphorus or arsenic; and/or other suitable dopants including combinations thereof. If the source/drain epitaxial structures 490S/490D are not in-situ doped, an implantation process (i.e., a junction implant process) is performed to dope the source/drain epitaxial structures 490S/490D. The source/drain epitaxial structures 490S/490D can be n-type doped for NMOS, and p-typed doped for PMOS. In some exemplary embodiments, the source/drain epitaxial structures 490S/490D in an NFET device include SiP, while those in a PFET device include GeSnB and/or SiGeSnB.

In some embodiments, the source/drain epitaxial structures 490S/490D each include a first epitaxial layer 492 and a second epitaxial layer 494 over the first epitaxial layer 492. The first and second epitaxial layers 492 and 494 may be different at least in germanium atomic percentage (Ge %) or phosphorus concentration (P %). In some embodiments, the first epitaxial layer 492 may be not only grown from top surfaces of the fins 430, but also grown from end surfaces of the channel layers 424.

In some embodiments where the source/drain epitaxial structures 490S/490D include SiP for forming NFETs, the first and second SiP layers 492 and 494 are different at least in phosphorous concentration (P %). In certain embodiments, the first SiP layer 492 has a lower phosphorous concentration than the second SiP layer 494. Low phosphorous concentration in the first SiP layer 492 may help in reducing the Schottky barrier with the un-doped Si in the fins 430. High phosphorous concentration in the second SiP layer 494 may help in reducing source/drain contact resistance. By way of example and not limitation, the phosphorous concentration in the first SiP layer 492 is in a range from about 5 E19 $cm^{-3}$ to about 1 E21 $cm^{-3}$, and the phosphorous concentration in the second SiP layer 494 is in a range from about 1 E21 $cm^{-3}$ to about 3 E21 $cm^{-3}$. In some embodiments, the second SiP layer 494 may have a gradient phosphorous concentration. For example, the phosphorous concentration in the second SiP layer 494 increases as the distance from the first SiP layer 492 increases.

Figure 18B:
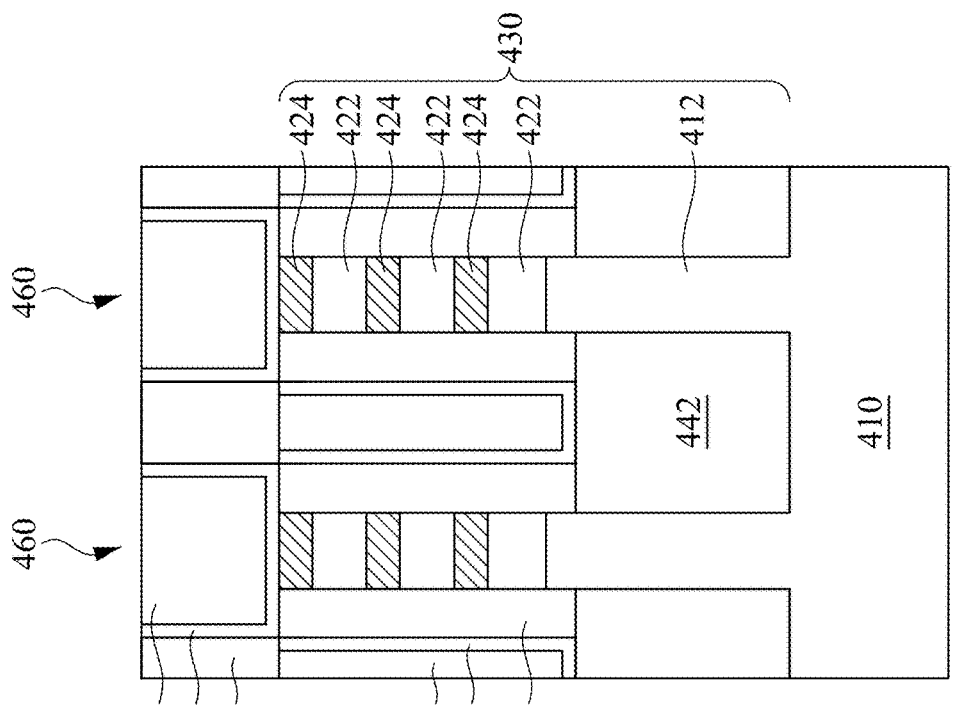
Figure 18A:
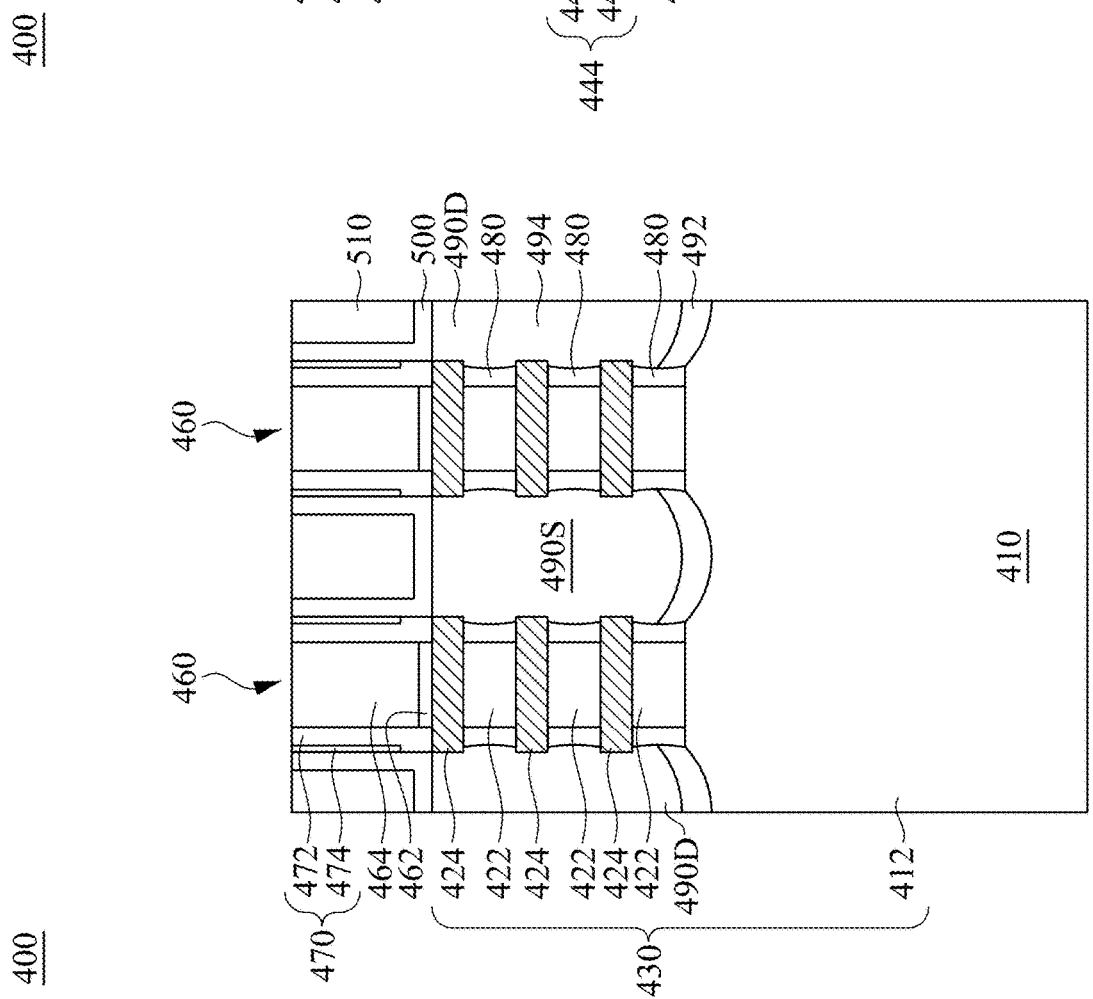

Reference is made to FIGS. 18A and 18B. A contact etch stop layer (CESL) 500 and an interlayer dielectric (ILD) layer 510 are formed in sequence over the substrate 410. In some embodiments, the CESL 500 includes a silicon nitride layer, a silicon oxide layer, a silicon oxynitride layer, and/or other suitable materials. The CESL 500 may be formed by plasma-enhanced chemical vapor deposition (PECVD) process and/or other suitable deposition or oxidation processes. The ILD layer 510 is then deposited over the CESL 270. In some embodiments, the ILD layer 510 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron-doped silicon glass (BSG), and/or other suitable dielectric materials having a different etch selectivity than the CESL 500. The ILD layer 510 may be deposited by a PECVD process or other suitable deposition technique.

After depositing the ILD layer 510, a planarization process may be performed to remove excess materials of the front-side ILD layer 510. For example, a planarization process includes a chemical mechanical planarization (CMP) process which removes portions of the ILD layer 510 and the CESL layer 500 overlying the dummy gate structures 460 and planarizes the top surface of the structure. In some embodiments, the CMP process also removes hard mask layers 466 and 468 in the dummy gate structures 460 (as shown in FIGS. 17A and 17B) and exposes the dummy gate electrode layer 464. Moreover, as illustrated in FIGS. 17B and 18B, the CMP process is performed until the top surfaces of the dielectric caps 446 are exposed, thus breaking a single continuous dummy gate structure 460 into multiple dummy gate structures 460 separated by the dielectric caps 446. As a result, an additional gate cut process can be skipped.

Figure 19B:
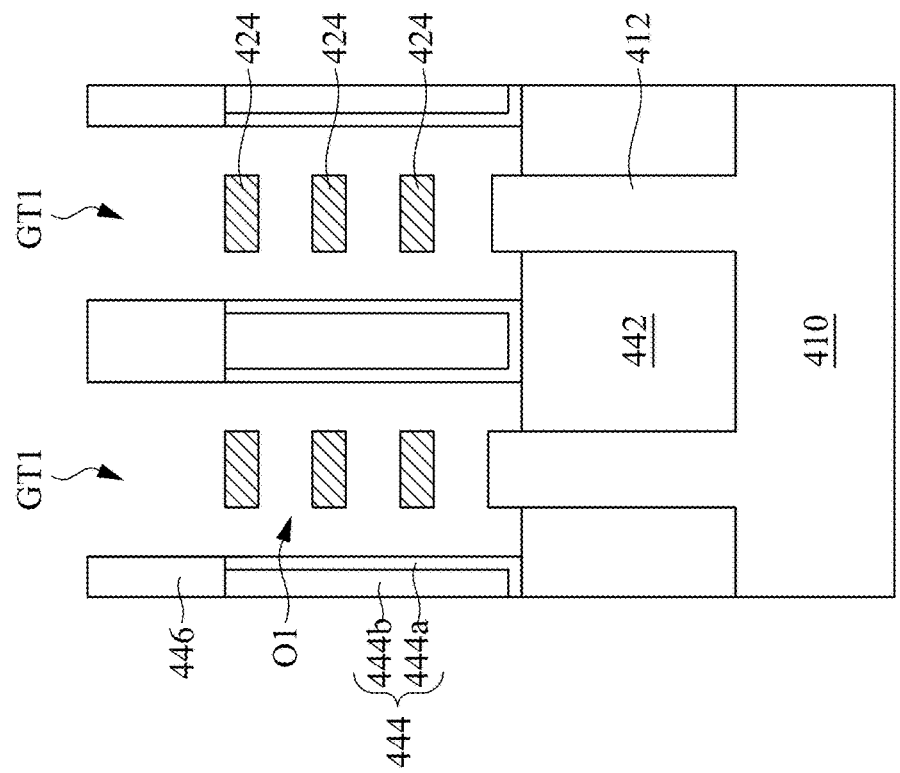
Figure 19A:
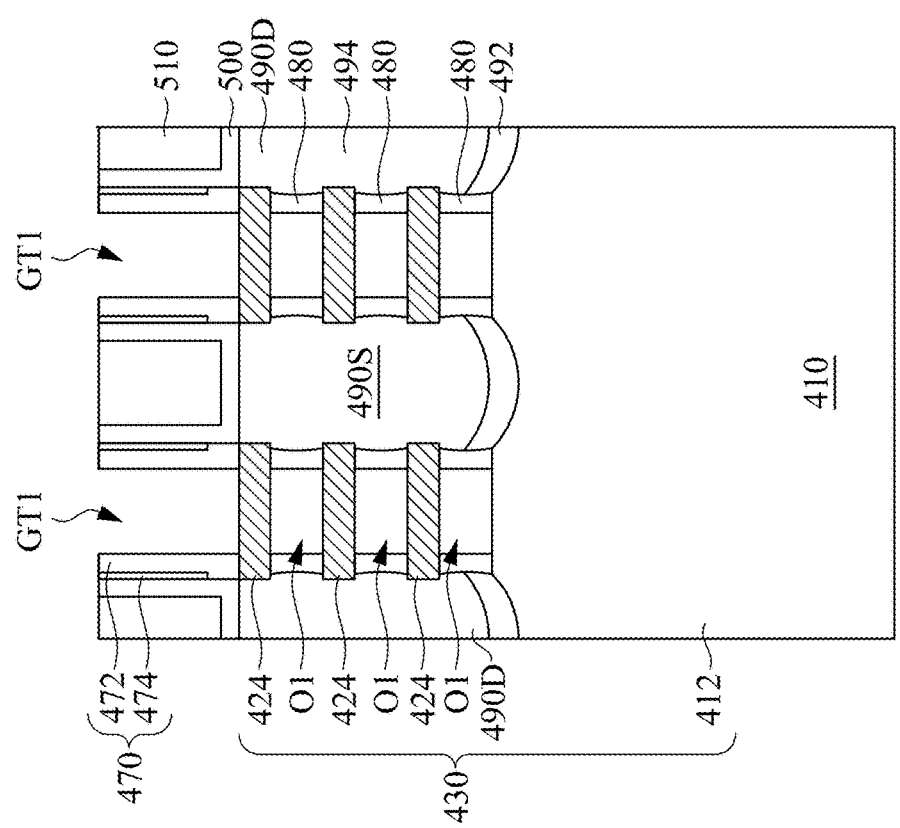

The dummy gate structures 460 are removed, followed by removing the sacrificial layers 422. The resulting structure is illustrated in FIGS. 19A and 19B. In the illustrated embodiments, the dummy gate structures 460 are removed by using a selective etching process (e.g., selective dry etching, selective wet etching, or a combination thereof) that etches the materials in dummy gate structures 460 at a faster etch rate than it etches other materials (e.g., gate sidewall spacers 470, CESL 500 and/or ILD layer 510), thus resulting in gate trenches GT1 between corresponding gate sidewall spacers 470, with the sacrificial layers 422 and the sacrificial epitaxial structures 450 exposed in the gate trenches GT1. Subsequently, the sacrificial layers 422 and the sacrificial epitaxial structures 450 in the gate trenches GT1 are etched by using another selective etching process that etches the sacrificial layers 422 and the sacrificial epitaxial structures 450 at a faster etch rate than it etches the channel layers 424, thus forming openings O1 between neighboring channel layers 424. In this way, the channel layers 424 become nanosheets suspended over the substrate 410 and between the source/drain epitaxial structures 490S/490D. This step is also called a channel release process. At this interim processing step, the openings O1 between nanosheets 424 may be filled with ambient environment conditions (e.g., air, nitrogen, etc). In some embodiments, the nanosheets 424 can be interchangeably referred to as nanowires, nanoslabs, and nanorings, depending on their geometry. For example, in some other embodiments the channel layers 424 may be trimmed to have a substantially rounded shape (i.e., cylindrical) due to the selective etching process for completely removing the sacrificial layers 422. In that case, the resultant channel layers 424 can be called nanowires.

In some embodiments, the sacrificial layers 422 and the sacrificial epitaxial structures 450 are removed by using a selective wet etching process. In some embodiments, the sacrificial layers 422 and the sacrificial epitaxial structures 170 are SiGe, and the channel layers 424 are silicon, allowing for the selective removal of the sacrificial layers 422 and the sacrificial epitaxial structures 450. In some embodiments, the selective wet etching includes an APM etch (e.g., ammonia hydroxide-hydrogen peroxide-water mixture). In some embodiments, the selective removal includes SiGe oxidation followed by $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because the oxidation rate of Si is much lower (sometimes 30 times lower) than the oxidation rate of SiGe, the channel layers 424 may remain substantially intact during the channel release process. In some embodiments, both the channel release step and the previous step of laterally recessing sacrificial layers use a selective etching process that etches SiGe at a faster etch rate than etching Si, and therefore these two steps may use the same etchant chemistry in some embodiments. In this case, the etching time/duration of the channel release step is longer than the etching time/duration of the previous step of laterally recessing sacrificial layers, so as to completely remove the sacrificial SiGe layers.

Reference is made to FIGS. 20A and 20B. Replacement gate structures 520 are respectively formed in the gate trenches GT1 and the openings O1 to surround each of the nanosheets 424 suspended in the gate trenches GT1. The gate structures 520 may be the final gates of GAA FETs. The final gate structure may be a high-k/metal gate stack, however other compositions are possible. In some embodiments, each of the gate structures 520 forms the gate associated with the multi-channels provided by the plurality of nanosheets 424. For example, high-k/metal gate structures 520 are formed within the openings O1 (as illustrated in FIGS. 19A-19B) provided by the release of nanosheets 424. In various embodiments, the high-k/metal gate structure 520 includes an interfacial layer 522 formed around the nanosheets 424, a high-k gate dielectric layer 524 formed around the interfacial layer 522, and a gate metal layer 526 formed around the high-k gate dielectric layer 524 and filling a remainder of gate trenches GT1. Formation of the high-k/metal gate structures 520 may include one or more deposition processes to form various gate materials, followed by a CMP process to remove excessive gate materials, resulting in the high-k/metal gate structures 520 having top surfaces level with a top surface of the ILD layer 510. As illustrated in the cross-sectional view of FIG. 20B, the high-k/metal gate structure 520 surrounds each of the nanosheets 424, and thus is referred to as a gate of a GAA FET.

In some embodiments, the interfacial layer 522 is silicon oxide formed on exposed surfaces of semiconductor materials in the gate trenches GT1 by using, for example, thermal oxidation, chemical oxidation, wet oxidation, or the like. As a result, surface portions of the nanosheets 424 and the substrate 410 exposed by the gate trenches GT1 and the openings O1 are oxidized into silicon oxide to form interfacial layer 292.

In some embodiments, the high-k gate dielectric layer 524 includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof. The high-k gate dielectric layer 524 can be deposited by ALD, CVD, PVD, the like, or the combination thereof.

In some embodiments, the gate metal layer 526 includes one or more metal layers. For example, the gate metal layer 526 may include a work function metal layer 526a. The work function metal layer 526a in the gate metal layer 526 provides a suitable work function for the high-k/metal gate structures 520. In some embodiments, the gate metal layer 526 may further include a fill metal 526b filling up the remainder of gate trenches GT1. The fill metal 526b may include a higher electrical conductance or a lower electrical resistivity than that of the work function metal layer 124. In some embodiments, the fill metal 526b may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. The fill metal 526b can be deposited by ALD, CVD, PVD, the like, or the combination thereof. In some other embodiments, the fill metal 526b may be omitted, and the gate metal layer 526 includes one or more work function metal layers.

To reduce the power consumption, the Fermi levels of the metal gates of n-MOSFETs and p-MOSFETs are desired to be close to the conduction band (~4.05 eV) and the valence band (~5.17 eV) of Si, respectively. In other words, an n-type MOS device (NMOS) and a p-type MOS device (PMOS) require different work functions for their respective gate structures. For an NMOS, the gate metal layer 526 may include an n-type work function metal (N-metal) layer 526a. In absence of the ALA treatment, the n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a PMOS, the gate metal layer 526 may include a p-type work function metal (P-metal) layer 526b. In absence of the ALA treatment, the p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. Some doping and/or post-annealing treatment may be performed to adjust the work function of metal layer 526a.

In some embodiments of the present disclosure, the work function metal layer 526a can be deposited by cycles of the ALD process with ALA treatment (referring to FIG. 5A-5F). By the ALA treatment, the work function of the work function metal layer 526a can be tuned to a desired value for NMOS and PMOS. Thus, the aforementioned p-type work function metals (e.g., titanium nitride) can be used in an NMOS device. For example, the TiN work function metal layer 526a can be deposited without doping, followed by the deposition of the fill metal 526b without post annealing the work function metal layer 526a. In some other embodiments, the work function metal layer 526a formed by the ALD process with ALA treatment may further be doped and/or post-annealed for further modulating its work function.

In furtherance of some embodiments, titanium nitride (TiN) may have a work function (e.g., ranging from about 4.52 eV to about 4.7 eV) suitable for PMOS in absence of the ALA treatment. In some embodiments of the present disclosure, by the ALA treatment, the work function of the titanium nitride can be tuned to below 4.5 eV, 4.3 eV, and even below 4.2 eV. For example, by the ALA treatment, the work function of the titanium nitride can be in a range from about 3.9 eV to about 4.5 eV, from about 3.9 eV to about 4.3 eV, from about 3.9 eV to about 4.2 eV, or from about 3.9 eV to about 4.1 eV. For example, the work function of the titanium nitride may be 4.03 eV in some embodiments. Therefore, an NMOS device has a dopant-free TiN work function layer can be achieved.

Figures 21A, 21B:
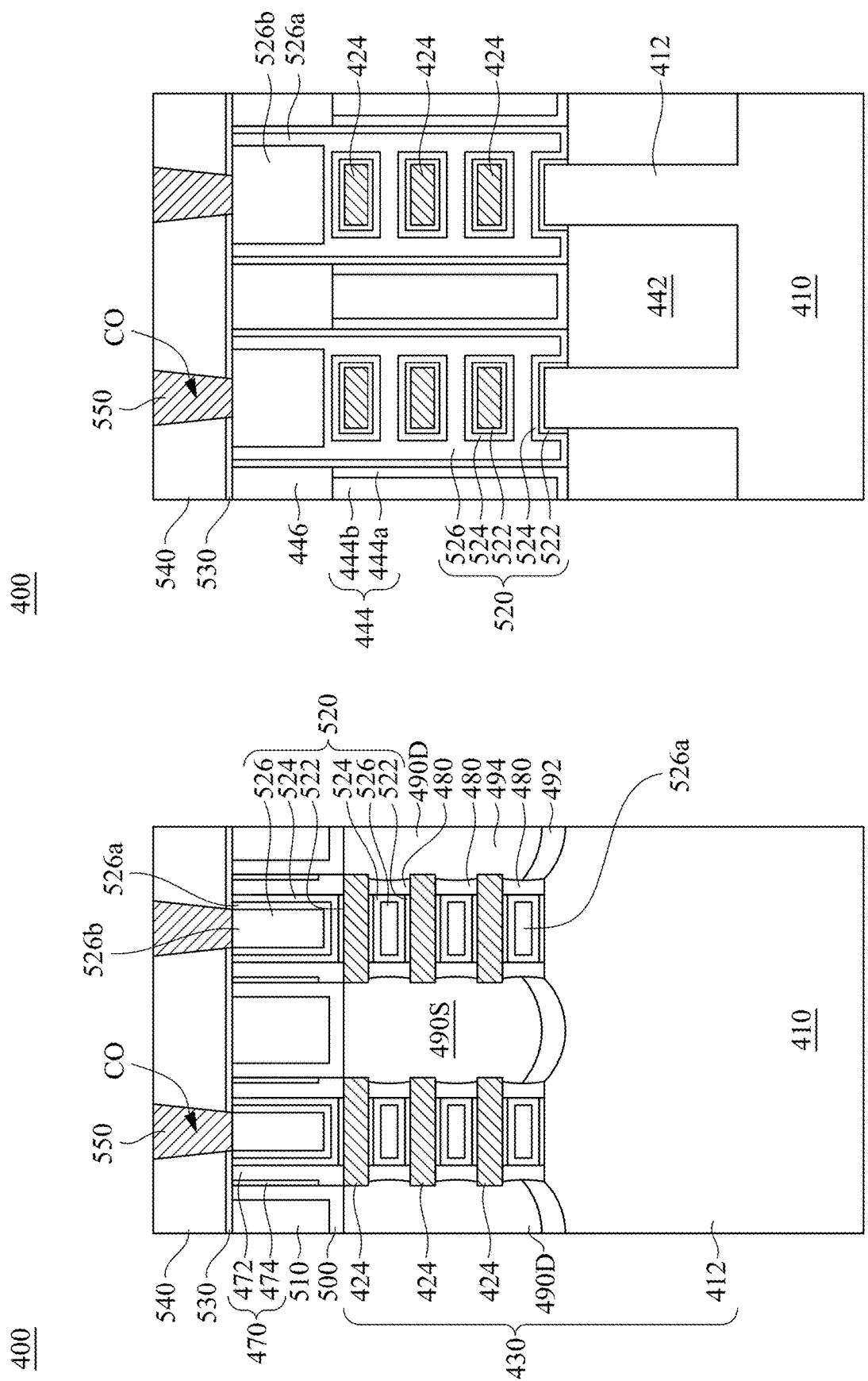

For example, the multi-gate device 400 in FIGS. 21A and 21B may include a semiconductor substrate 410, a gate structure 520, and n-type source/drain features 490S/490D. The gate structure 520 is over a channel region of the semiconductor substrate 410. The source/drain features 490S/490D are on opposite sides of the channel region. The gate structure 520 comprises gate dielectric layers 522, 524, a gate metal 526b, and a titanium nitride layer 526a between the gate dielectric layer 524 and the gate metal 526b. The titanium nitride layer 526a may fill up a space between the gate dielectric layer 524 and the gate metal 526b. For example, the top and bottom surfaces of the titanium nitride layer 526a are in contact with the gate dielectric layer 524 and the gate metal 526b. The titanium nitride layer 526b, fabricated by the ALA treatment, is dopant-free and may have a work function in a range from 3.9 eV to 4.5 eV. Furthermore, the titanium nitride layer 526b, fabricated by the ALA treatment, may have a nitrogen atomic concentration in a range from 43% to 55%, an oxygen atomic concentration less than 1%, a density in a range from 5 $g/cm^3$ to 6 $g/cm^3$, and/or a resistivity in a range from 100 μΩ cm to 400 μΩ cm. In some embodiments, the n-type source/ drain features 490S/490D may include an n-type semiconductor material, such as silicon, silicon carbide (SiC), silicon phosphide (SiP). In some embodiments, the n-type source/drain features 490S/490D may be doped with n-type dopants, such as phosphorus or arsenic.

FIGS. 21A and 21B illustrate cross-sectional views of the formation of gate contacts 550 over the gate metal layer 526. ILD layer 540 is formed over the structure of FIGS. 20A and 20B. The ILD layer 540 may be formed of a similar material to the ILD layer 510 by using similar deposition techniques to the ILD layer 510 as discussed previously, and thus is not described again for the sake of brevity. In some embodiments, prior to the formation of the ILD layer 540, a CESL 530 is formed. The CESL 530 may be formed of a similar material to the CESL 500 by using similar deposition techniques to the CESL 500 as discussed previously, and thus is not described again for the sake of brevity. The contact openings CO are formed using one or more etching processes to etch through the ILD layers 540 and the CESL 530. In some embodiments, the contact formation step deposits one or more metal materials (e.g., W, Ru, Co, Cu, Ti, TiN, Ta, TaN, Mo, Ni, the like or combinations thereof) to fill the contact openings CO by using suitable deposition techniques (e.g., CVD, PVD, ALD, the like or combinations thereof), followed by a CMP process to remove excess metal materials outside the contact openings CO, while leaving metal materials in the contact openings CO to serve as the gate contacts 550.

FIGS. 22A-23B illustrate perspective views and cross-sectional views of intermediate stages in the formation of a FinFET device in accordance with some embodiments of the present disclosure. The present embodiments are similar to the embodiments of FIGS. 13-21B, except that a FinFET device is formed.

Figure 22A:
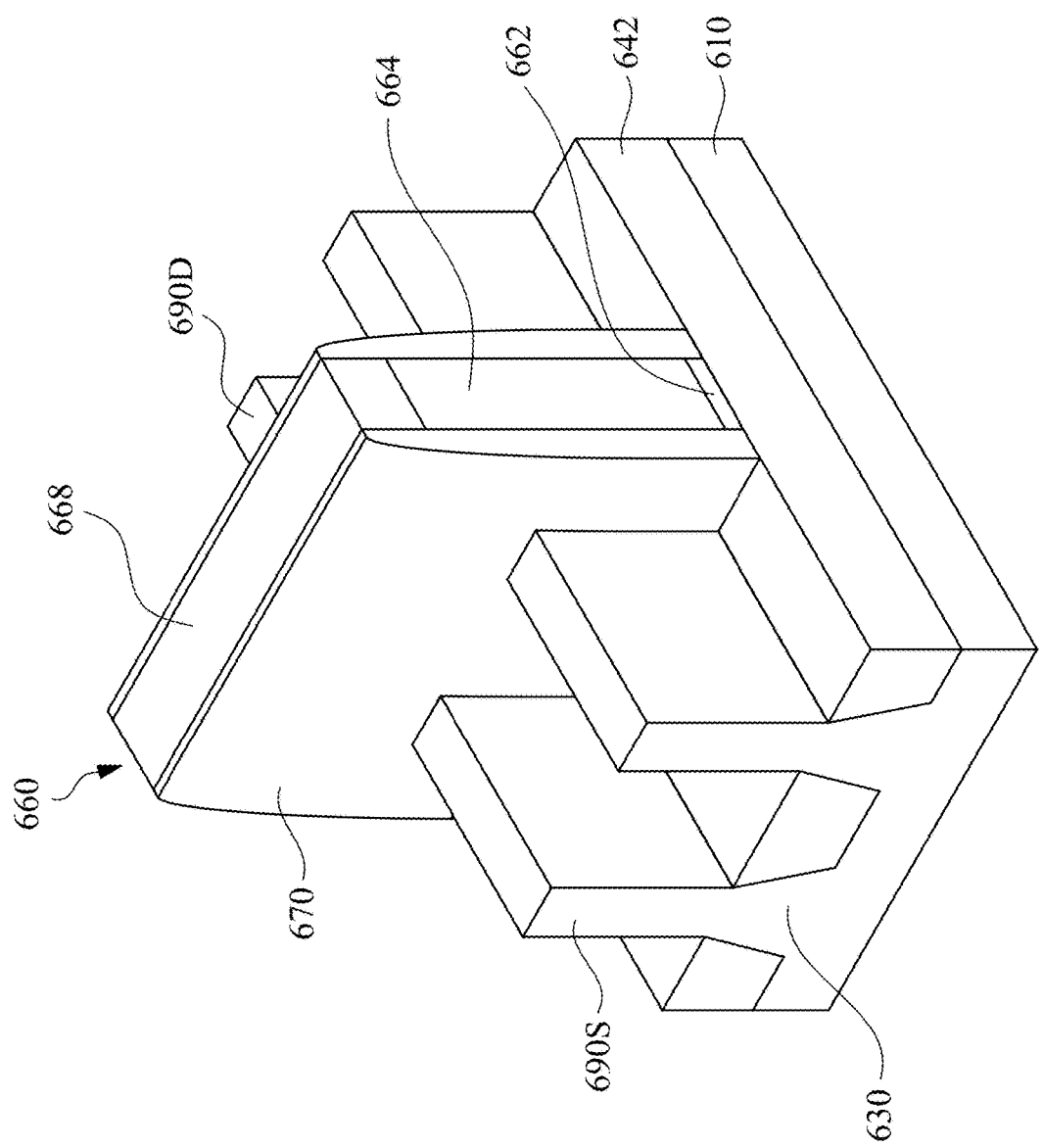
FIGS. 22A-23B illustrate perspective views and cross-sectional views of intermediate stages in the formation of a fin field-effect transistor (FinFET) device in accordance with some embodiments of the present disclosure.
Figure 22B:
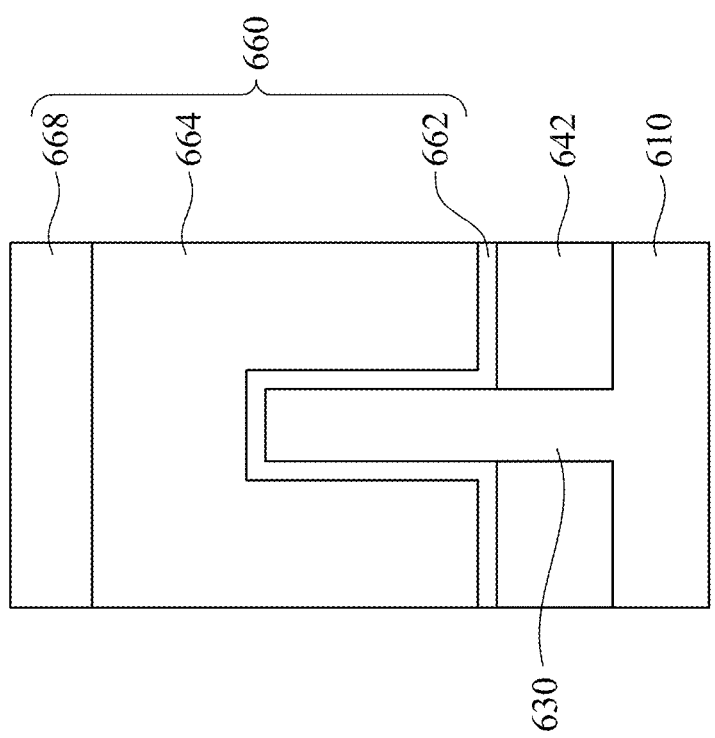

Reference is made to FIGS. 22A and 22B. A semiconductor substrate 610 is provided. The substrate 610 is patterned to have fins 630. STI features 642 are formed around the fins 630. A gate structure 660 is formed at least partially over the fins 430. In some embodiments, the gate structure 660 is a dummy (sacrificial) gate structure that is subsequently removed. The gate structure 660 may include a dummy gate dielectric layer 662, a dummy gate electrode layer 664, and a hard mask 668. Gate sidewall spacers 670 are formed on opposite sides of the gate structure 660. Source/drain regions 690S/690D may be formed on opposite sides of the gate structure 660 and spaced apart from the gate structure 660 by the gate sidewall spacers 670. In some embodiments, the source/drain regions 690S/690D can be doped regions in the fins 630 or source/drain epitaxial structures over the fins 630. The source/drain regions 690S/690D can be n-type doped for NMOS, and p-typed doped for PMOS.

Other details of the semiconductor substrate 610, the fins 630, the STI features 642, the gate structure 660 (e.g., the gate dielectric layer 662, the gate electrode layer 664, and the hard mask 668), the gate sidewall spacers 670, and the source/drain regions 690S/690D are similar to the substrate 410, the fins 430, the STI features 442, the gate structure 460 (e.g., the gate dielectric layer 462, the gate electrode layer 464, and the hard mask), the gate sidewall spacers 470, and the source/drain epitaxial structures 490S/490D in the embodiments of FIGS. 13-21B, and thereto not repeated herein.

Figure 23A:
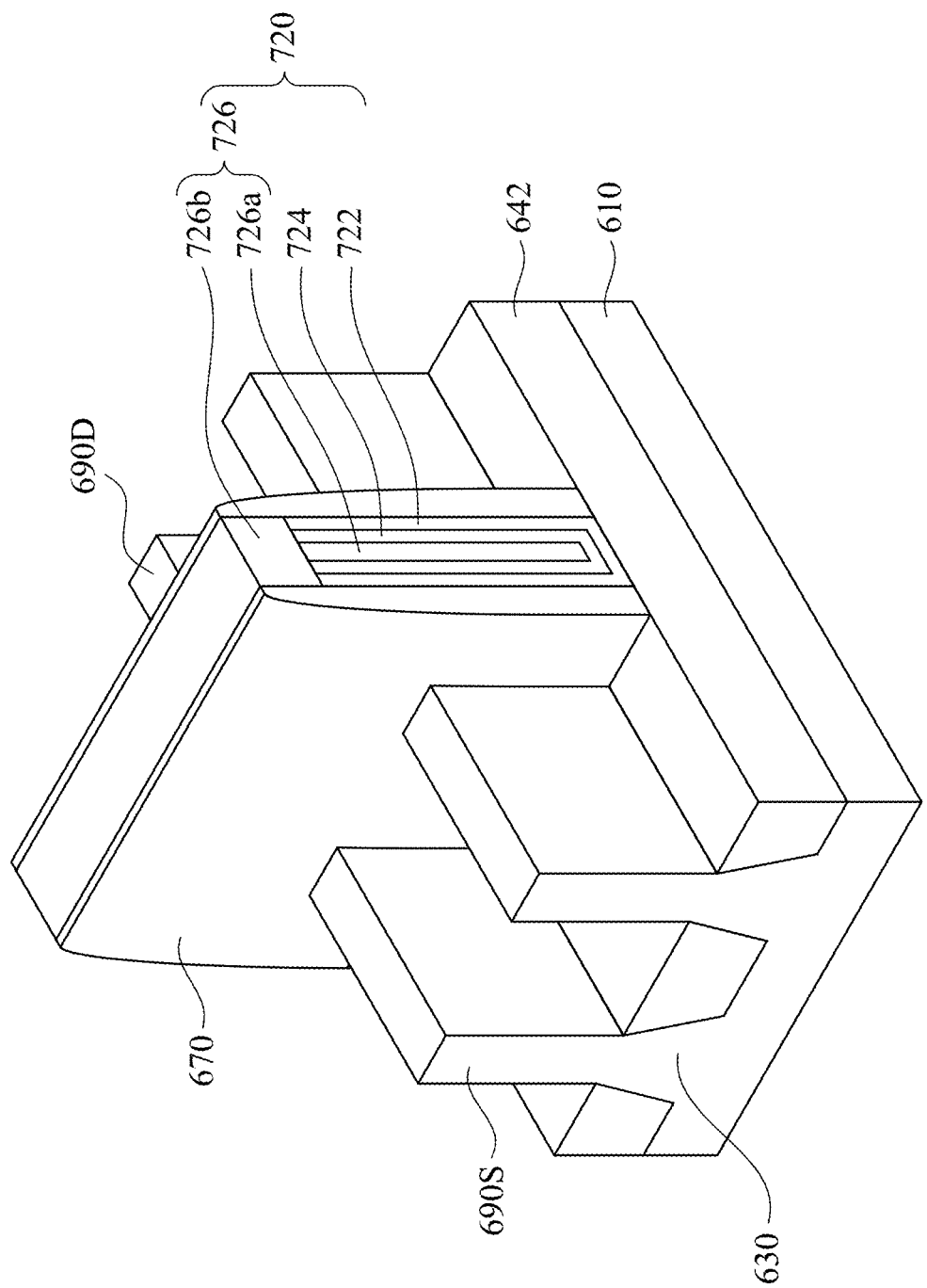
Figure 23B:
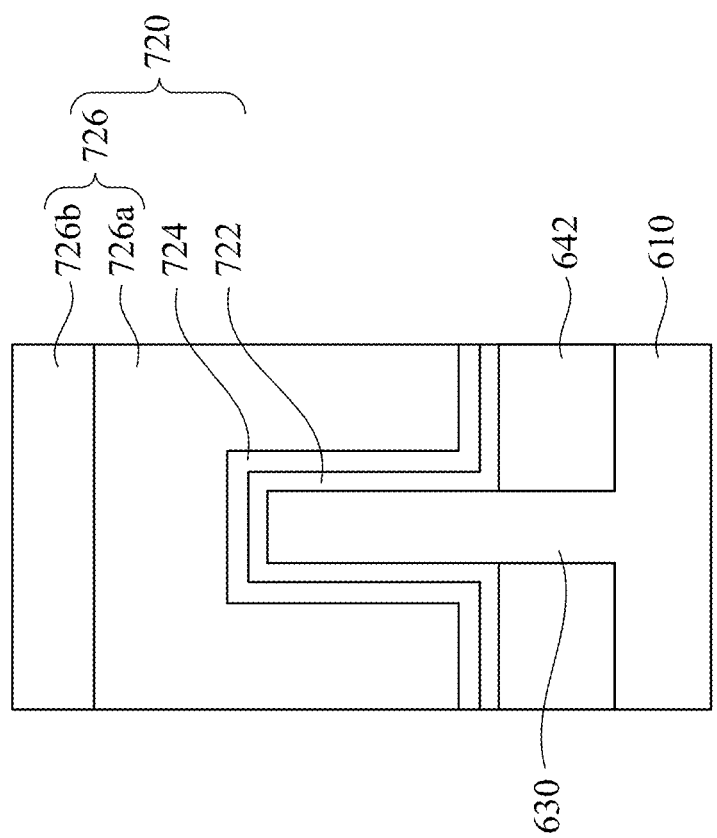

Reference is made to FIGS. 23A and 23B. The dummy gate structure 660 is removed and leaving a gate trench between the gate sidewall spacers 670, and a replacement gate structure 720 is formed in the gate trench. The replacement gate structure 720 may be a high-k/metal gate stack. In some embodiments, the replacement gate structure 720 may include an interfacial layer 722, a high-k gate dielectric layer 724, and a gate metal layer 726, in which the gate metal layer 726 may include a work function metal layer 726a and a fill metal 726b.

As aforementioned, in some embodiments of the present disclosure, the work function metal layer 726a can be deposited by cycles of the ALD process with ALA treatment (referring to FIG. 5A-5F). By the ALA treatment, the work function of the work function metal layer 726a can be tuned, without doping and post-annealing treatment, to a desired value for NMOS and PMOS. For example, an NMOS device has a TiN work function layer can be achieved.

Other details of the gate structure 720 (e.g., the interfacial layer 722, the high-k gate dielectric layer 724, the work function metal layer 726a, and the fill metal 726b) are similar to that of the gate structure 520 (e.g., the interfacial layer 522, the high-k gate dielectric layer 524, the work function metal layer 526a, and the fill metal 526b) in the embodiments of FIGS. 13-21B, and thereto not repeated herein.

Figure 24:
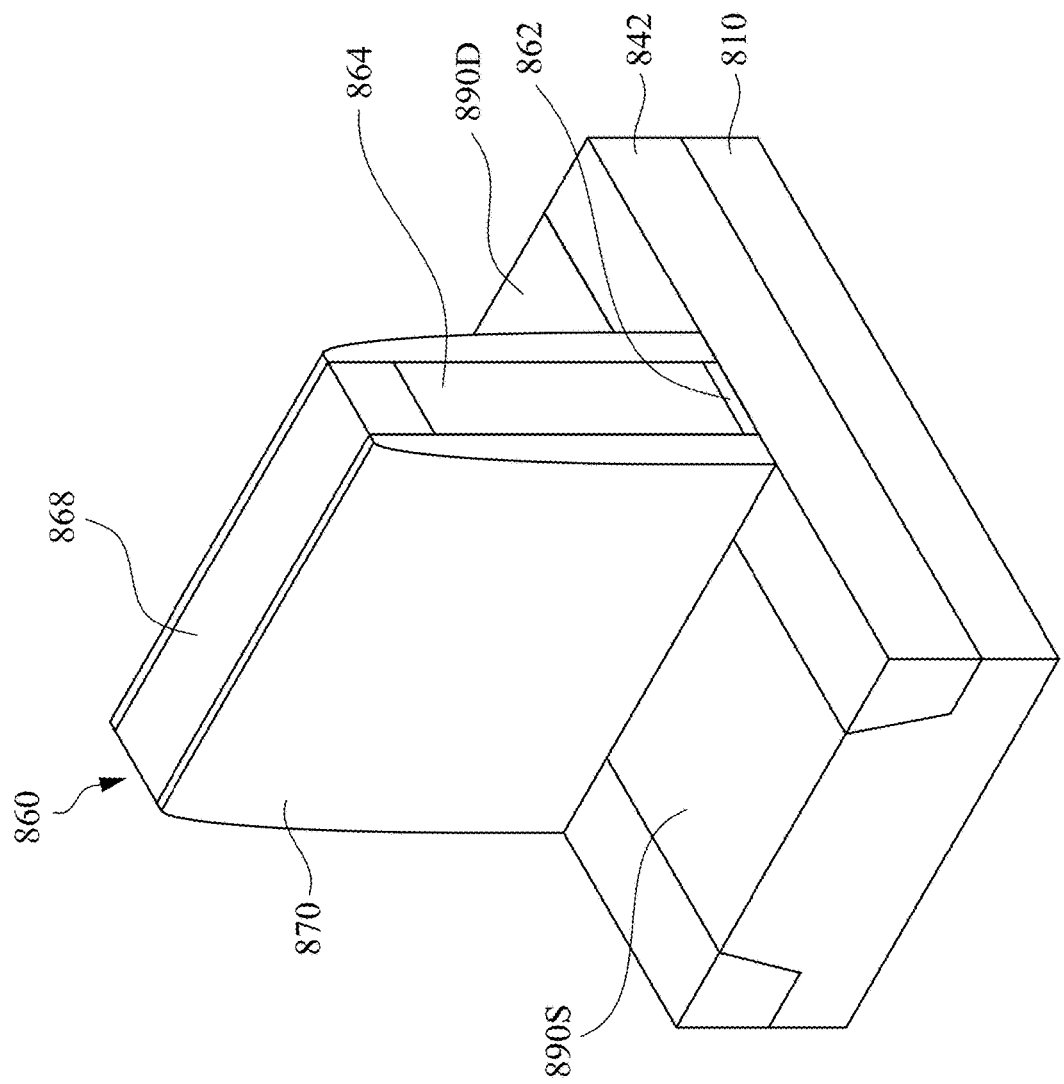
FIGS. 24-25 illustrate perspective views and cross-sectional views of intermediate stages in the formation of a planar device in accordance with some embodiments of the present disclosure.
Figure 25:
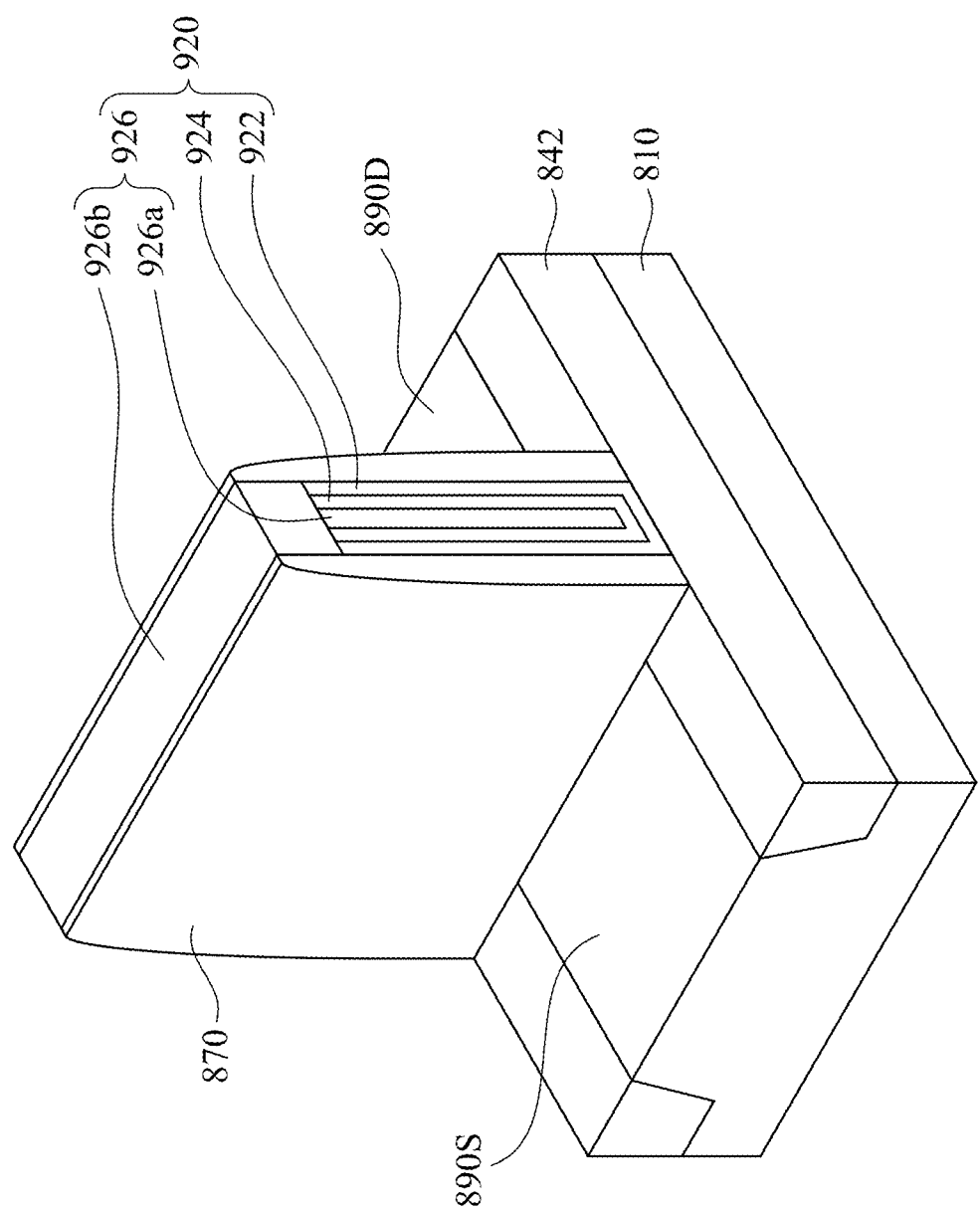

FIGS. 24-25 illustrate perspective views and cross-sectional views of intermediate stages in the formation of a planar device in accordance with some embodiments of the present disclosure. The present embodiments are similar to the embodiments of FIGS. 22A-23B, except that a planar device is formed.

Reference is made to FIG. 24. A semiconductor substrate 810 is provided. STI features 842 are formed around a channel region of the semiconductor substrate 810. A gate structure 860 is formed at least partially over the channel region. In some embodiments, the gate structure 860 is a dummy (sacrificial) gate structure that is subsequently removed. The gate structure 860 may include a dummy gate dielectric layer 862, a dummy gate electrode layer 864, and a hard mask 868. Gate sidewall spacers 870 are formed on opposite sides of the gate structure 860. Source/drain regions 890S/890D may be formed on opposite sides of the gate structure 860 and spaced apart from the gate structure 860 by the gate sidewall spacers 870. In some embodiments, the source/drain regions 890S/890D can be doped regions in the substrate 810 or source/drain epitaxial structures over the substrate 810. The source/drain regions 890S/890D can be n-type doped for NMOS, and p-typed doped for PMOS.

Other details of the semiconductor substrate 810, the STI features 842, the gate structure 860 (e.g., the gate dielectric layer 862, the gate electrode layer 864, and the hard mask 868), the gate sidewall spacers 870, and the source/drain regions 890S/890D are similar to the substrate 410, the STI features 442, the gate structure 460 (e.g., the gate dielectric layer 462, the gate electrode layer 464, and the hard mask), the gate sidewall spacers 470, and the source/drain epitaxial structures 490S/490D in the embodiments of FIGS. 13-21B, and thereto not repeated herein.

Reference is made to FIG. 25. The dummy gate structure 860 is removed and leaving a gate trench between the gate sidewall spacers 870, and a replacement gate structure 920 is formed in the gate trench. The replacement gate structure 920 may be a high-k/metal gate stack. In some embodiments, the replacement gate structure 920 may include an interfacial layer 922, a high-k gate dielectric layer 924, a gate metal layer 926, in which the gate metal layer 926 may include a work function metal layer 926a and a fill metal 926b.

As aforementioned, in some embodiments of the present disclosure, the work function metal layer 926a can be deposited by cycles of the ALD process with ALA treatment (referring to FIG. 5A-5F). By the ALA treatment, the work function of the work function metal layer 926a can be tuned, without doping and post-annealing treatment, to a desired value for NMOS and PMOS. For example, an NMOS device that has a TiN work function layer can be achieved.

Other details of the gate structure 920 (e.g., the interfacial layer 922, the high-k gate dielectric layer 924, the work function metal layer 926a, and the fill metal 926b) are similar to that of the gate structure 520 (e.g., the interfacial layer 522, the high-k gate dielectric layer 524, the work function metal layer 526a, and the fill metal 526b) in the embodiments of FIGS. 13-21B, and thereto not repeated herein.

Based on the above discussions, it can be seen that the present disclosure offers advantages to the HKMG devices. It is understood, however, that other embodiments may offer additional advantages, and not all advantages are necessarily disclosed herein, and that no particular advantage is required for all embodiments. One advantage is that the work function and material properties of TiN thin film can be effectively modulated at a low temperature (e.g., below about 400° C., such as about 300° C.) by incorporating a plasma treatment into an ALD process, in which the plasma treatment can induce atomic-layer annealing (ALA) in the ALD process. Another advantage is that the work function of the metal gate can be modulated without doping and post-annealing treatment. Still another advantage is that the ALA treatment can be well integrated with the very-large-scale integration (VLSI) process. Still another advantage is that the plasma energy of the ALA treatment can be controlled by substrate bias and upper chamber plasma, thereby directly affecting the ALD growth process.

According to some embodiments of the present disclosure, a method for fabricating a semiconductor device is provided. The method includes depositing a gate dielectric layer over a semiconductor substrate; depositing a work function layer over the gate dielectric layer by an atomic layer deposition (ALD) process, wherein the work function layer comprises a metal element and a nonmetal element, and the ALD process comprises a plurality of cycles. Each of the cycles comprises: introducing a precursor gas comprising the metal element to a chamber to form a precursor surface layer on the semiconductor substrate in the chamber; purging a remaining portion of the precursor gas away from the chamber; performing a reactive-gas plasma treatment using a reactive-gas plasma comprising the nonmetal element to convert the precursor surface layer into a monolayer of the work function layer; purging a remaining portion of the reactive-gas plasma away from the chamber, and performing an inert-gas plasma treatment in the chamber.

According to some embodiments of the present disclosure, a method for fabricating a semiconductor device is provided. The method includes depositing a gate dielectric layer over a semiconductor substrate; depositing a titanium nitride layer over the gate dielectric layer by an atomic layer deposition (ALD) process. The ALD process comprises at least a first cycle comprising: exposing the semiconductor substrate to a metal-containing precursor; exposing the semiconductor substrate to a nitrogen-containing plasma after exposing the semiconductor substrate to the metal-containing precursor; and exposing the semiconductor substrate to an inert-gas plasma.

According to some embodiments of the present disclosure, a semiconductor device includes a semiconductor substrate, a gate structure, and source/drain features. The gate structure is over a channel region of the semiconductor substrate, wherein the gate structure comprises a gate dielectric layer, a gate metal, and a metal nitride layer between the gate dielectric layer and the gate metal, and the metal nitride layer is dopant-free and has a work function less than 4.5 eV. The n-type doped source/drain features are on opposite sides of the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   depositing a gate dielectric layer over a semiconductor substrate; and
   depositing a work function layer over the gate dielectric layer by an atomic layer deposition (ALD) process, wherein the work function layer comprises a metal element and a nonmetal element, and the ALD process comprises a plurality of cycles, and each of the cycles comprises:
   introducing a precursor gas comprising the metal element to a chamber to form a precursor surface layer on the semiconductor substrate in the chamber;
   purging a remaining portion of the precursor gas away from the chamber;
   performing a reactive-gas plasma treatment using a reactive-gas plasma comprising the nonmetal element to convert the precursor surface layer into a monolayer of the work function layer;
   purging a remaining portion of the reactive-gas plasma away from the chamber; and
   performing a first inert-gas plasma treatment in the chamber.

2. The method of claim 1, wherein the first inert-gas plasma treatment is performed after purging the remaining portion of the reactive-gas plasma away from the chamber.

3. The method of claim 2, wherein each of the cycles of the ALD process comprises:
   performing a second inert-gas plasma treatment after purging the remaining portion of the precursor gas away from the chamber and before performing the reactive-gas plasma treatment.

4. The method of claim 1, wherein the first inert-gas plasma treatment is performed after purging the remaining portion of the precursor gas away from the chamber and before performing the reactive-gas plasma treatment.

5. The method of claim 1, wherein the first inert-gas plasma treatment is performed without the nonmetal element.

6. The method of claim 1, wherein the metal element and the nonmetal element are titanium and nitrogen, respectively.

7. The method of claim 1, wherein the first inert-gas plasma treatment is performed by biasing the semiconductor substrate.

8. The method of claim 1, wherein the first inert-gas plasma treatment is performed by using a remote chamber plasma source.

9. The method of claim 1, further comprising:
depositing a gate metal directly over the work function layer, wherein the work function layer is a dopant-free metal nitride layer, and the gate dielectric layer, the work function layer, and the gate metal form a gate structure; and
forming n-type source/drain features on opposite sides of the gate structure.

10. A method for fabricating a semiconductor device, comprising:
depositing a gate dielectric layer over a semiconductor substrate;
depositing a metal nitride layer over the gate dielectric layer by an atomic layer deposition (ALD) process, and the ALD process comprises a plurality of cycles, each of the cycles comprising:
exposing the semiconductor substrate to a metal-containing precursor;
exposing the semiconductor substrate to a nitrogen-containing plasma after exposing the semiconductor substrate to the metal-containing precursor; and
exposing the semiconductor substrate to an inert-gas plasma by a time duration less than a time duration of one of the cycles.

11. The method of claim 10, wherein exposing the semiconductor substrate to the inert-gas plasma is performed in an ALD chamber without nitrogen in the ALD chamber.

12. The method of claim 11, wherein the cycle further comprising:
purging the ALD chamber prior to exposing the semiconductor substrate to the inert-gas plasma.

13. The method of claim 10, wherein exposing the semiconductor substrate to the inert-gas plasma is performed between exposing the semiconductor substrate to the metal-containing precursor and exposing the semiconductor substrate to the nitrogen-containing plasma.

14. The method of claim 10, wherein exposing the semiconductor substrate to the inert-gas plasma is performed after exposing the semiconductor substrate to the nitrogen-containing plasma.

15. The method of claim 10, wherein the deposited metal nitride layer is dopant-free and has a work function in a range from 3.9 eV to 4.5 eV.

16. The method of claim 10, wherein exposing the semiconductor substrate to the inert-gas plasma is performed by the time duration in a range from about 1 second to about 300 seconds.

17. A semiconductor device, comprising:
a semiconductor substrate;
a gate structure over a channel region of the semiconductor substrate, wherein the gate structure comprises a gate dielectric layer, a gate metal, and a metal nitride layer between the gate dielectric layer and the gate metal, the metal nitride layer is dopant-free and has a work function less than 4.5 eV, and a nitrogen atomic concentration of the metal nitride layer is in a range from 43% to 55%, and an oxygen atomic concentration of the metal nitride layer is less than 1%; and
n-type doped source/drain features on opposite sides of the channel region.

18. The semiconductor device of claim 17, wherein top and bottom surfaces of the metal nitride layer are respectively in contact with the gate dielectric layer and the gate metal.

19. The semiconductor device of claim 17, wherein a density of the metal nitride layer is in a range from 5 g/cm$^3$ to 6 g/cm$^3$.

20. The semiconductor device of claim 17, wherein the metal nitride layer is a titanium nitride layer.

* * * * *